(12) United States Patent
Mizuno et al.

(10) Patent No.: US 8,277,948 B2
(45) Date of Patent: Oct. 2, 2012

(54) THERMOSETTING RESIN COMPOSITION OF SEMI-IPN COMPOSITE, AND VARNISH, PREPREG AND METAL CLAD LAMINATED BOARD USING THE SAME

(75) Inventors: Yasuyuki Mizuno, Chikusei (JP);
Daisuke Fujimoto, Chikusei (JP);
Kazutoshi Danjobara, Chikusei (JP);
Hikari Murai, Chikusei (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 978 days.

(21) Appl. No.: 12/279,571

(22) PCT Filed: Feb. 14, 2007

(86) PCT No.: PCT/JP2007/052610
§ 371 (c)(1),
(2), (4) Date: Aug. 15, 2008

(87) PCT Pub. No.: WO2007/094359
PCT Pub. Date: Aug. 23, 2007

(65) Prior Publication Data
US 2010/0233495 A1  Sep. 16, 2010

(30) Foreign Application Priority Data

Feb. 17, 2006 (JP) ................. 2006-040647
Apr. 20, 2006 (JP) ................. 2006-116405
Sep. 12, 2006 (JP) ................. 2006-246722

(51) Int. Cl.
*B32B 15/08* (2006.01)
(52) U.S. Cl. ........ 428/462; 525/132; 525/149; 525/219; 525/331.9; 525/375; 525/391; 525/397; 428/297.4; 428/521
(58) Field of Classification Search .......... 525/132, 525/219, 331.9, 391, 149, 375, 397; 428/297.4, 428/462, 521
See application file for complete search history.

(56) References Cited

U.S. PATENT DOCUMENTS

| | | |
|---|---|---|
| 4,389,516 A | 6/1983 | Sugio et al. |
| 2004/0146692 A1* | 7/2004 | Inoue et al. .......... 428/141 |

FOREIGN PATENT DOCUMENTS

| | | | |
|---|---|---|---|
| DE | 31 11 403 | | 1/1982 |
| EP | 0 889 096 | | 1/1999 |
| EP | 1 517 595 | | 3/2005 |
| GB | 2172892 | | 10/1986 |
| JP | 74-009629 | * | 3/1974 |
| JP | 56-141349 | | 11/1981 |
| JP | 58-164638 | | 9/1983 |
| JP | 59-193929 | | 11/1984 |
| JP | 62-148512 | | 7/1987 |
| JP | 63-159443 | | 7/1988 |
| JP | 02-208355 | | 8/1990 |
| JP | 03-275760 | | 12/1991 |
| JP | 06-179734 | | 6/1994 |
| JP | 06-184213 | | 7/1994 |
| JP | 07-292126 | | 11/1995 |
| JP | 09-290481 | * | 11/1997 |
| JP | 11-012456 | * | 1/1999 |

OTHER PUBLICATIONS

Takeuchi, Y.; Sekimoto, A.; Abe, M.; New Industrial Polymers, 1974, p. 15-25.*
Translation of the International Preliminary Report on Patentability dated Oct. 9, 2008, for International Application No. PCT/JP2007/052610, filed Feb. 14, 2007.
Extended European Search Report, including Supplementary European Search Report and European Search Opinion, dated Jun. 10, 2010, for Application No. EP 07 71 4163.
Extended European Search Report dated Dec. 14, 2011, for EP 11184652.3-1214.

* cited by examiner

*Primary Examiner* — David W Wu
*Assistant Examiner* — Robert Jones, Jr.
(74) *Attorney, Agent, or Firm* — Antonelli, Terry, Stout & Kraus, LLP.

(57) ABSTRACT

Provided is a thermosetting resin composition which can be used for the production of printed circuit boards, having good dielectric properties in high frequency bands so that transmission loss can be significantly lowered, having excellent heat resistance after moisture absorption and thermal expansion properties, and satisfying peeling strength between the resin composition and metal foil.
The present invention relates to a thermosetting resin composition of a semi-IPN composite, comprising (A) a polyphenylene ether, and a prepolymer formed from (B) a chemically unmodified butadiene polymer containing 40% or more of a 1,2-butadiene unit having a 1 2,-vinyl group in a side chain of a molecule and (C) a crosslinking agent, in a compatibilized and uncured state; and a resin varnish, a prepreg and a metal clad laminated board using the same.

17 Claims, No Drawings

THERMOSETTING RESIN COMPOSITION OF SEMI-IPN COMPOSITE, AND VARNISH, PREPREG AND METAL CLAD LAMINATED BOARD USING THE SAME

TECHNICAL FIELD

The present invention relates to a thermosetting resin composition of a novel semi-IPN composite, and a resin varnish, a prepreg and a metal clad laminate for printed circuit boards using the same. More particularly, the present invention relates to a thermosetting resin composition of a novel semi-IPN composite used in electronic devices such as those having an operating frequency exceeding 1 GHz, and a resin varnish, a prepreg and a metal clad laminated board for printed circuit boards using the same.

BACKGROUND ART

It is demanded in mobile telecommunication devices represented by cellular phones and base stations thereof, network-associated electronic devices such as servers and routers, and large scale computers, to transmit and process large amounts of data at a high speed with low loss. In the case of transmitting and processing large amounts of data, since electric signals are of high frequencies, rapid transmission and processing of data can be achieved. However, in principle, when the frequency of an electric signal increases, the signal is definitely prone to attenuate; that is, high frequency electric signal is prone to have weakened output power, with shorter transmission distance, and has properties that are likely to cause high loss. Therefore, in order to meet the above-mentioned requirements of low loss and high speed, it is necessary to reduce the transmission loss, particularly the transmission loss in high frequency bands, among the properties of a printed circuit board itself which is mounted in a device and performs transmission and processing of data.

To obtain printed circuit boards having low transmission loss, substrate materials utilizing fluorine-based resins having low dielectric constant and low dielectric dissipation factor have been traditionally used. However, fluorine-based resins in general have high melting temperatures and high melt viscosities, while having relative low fluidity. Thus, the resins have a problem of requiring the setting of high temperature and high pressure conditions in press molding. Moreover, fluorine-based resins also have a problem that their workability, dimensional stability, and adhesiveness to metal plating are insufficient to be used for the applications in high multilayer printed circuit boards that are used in the aforementioned telecommunication devices, network-associated electronic devices, and large scale computers.

Thus, there has been conducted research on the resin materials for printed circuit boards to cope with high frequency applications and to replace the fluorine-based resins. Among them, use of polyphenylene ether which is known as one of the resins having the most excellent dielectric properties among heat resistant polymers, is attracting more attention. However, polyphenylene ether is a thermoplastic resin having high melting temperature and high melt viscosity, as is the case of the fluorine-based resins. Therefore, for the applications in printed circuit boards, resin compositions containing polyphenylene ether and a thermosetting resin in combination have been used, in order to lower the melting point and melt viscosity, and to thereby set the temperature and pressure conditions low during press molding, or for the purpose of imparting thermal resistance to polyphenylene ether to withstand a temperature greater than the melting temperature (230 to 250° C.). For example, a resin composition using an epoxy resin in combination (see Patent Document 1), a resin composition using a bismaleimide in combination (see Patent Document 2), a resin composition using a cyanate ester in combination (see Patent Document 3), a resin composition using a styrene-butadiene copolymer, or polystyrene with triallyl cyanurate or triallyl isocyanurate in combination (see Patent Documents 4 and 5), a resin composition using polybutadiene in combination (see Patent Document 6 and Patent Document 7), a resin composition prepared by preliminarily-reacting a modified polybutadiene having a functional group such as a hydroxyl group, an epoxy group, a carboxyl group or a (meth)acryl group, with bismaleimide and/or a cyanate ester (see Patent Document 8), a resin composition using triallyl cyanurate, triallyl isocyanurate, polybutadiene or the like in combination with a polyphenylene ether which has been granted or grafted with a compound having a group having an unsaturated double bond (see Patent Document 9 and Patent Document 10), a resin composition using a reaction product of polyphenylene ether and an unsaturated carboxylic acid or unsaturated acid anhydride, and bismaleimide or the like in combination (see Patent Document 11), and the like have been proposed. According to these documents, it is disclosed that in order to improve the above-described defects of thermoplasticity while maintaining the properties of low transmission loss of polyphenylene ether, the resin obtained after curing preferably does not have many polar functional groups.

[Patent Document 1] Japanese Patent Application Laid-Open No. 58-69046
[Patent Document 2] Japanese Patent Application Laid-Open No. 56-133355
[Patent Document 3] Japanese Published Examined Application No. 61-18937
[Patent Document 4] Japanese Patent Application Laid-Open No. 61-286130
[Patent Document 5] Japanese Patent Application Laid-Open No. 3-275760
[Patent Document 6] Japanese Patent Application Laid-Open No. 62-148512
[Patent Document 7] Japanese Patent Application Laid-Open No. 59-193929
[Patent Document 8] Japanese Patent Application Laid-Open No. 58-164638
[Patent Document 9] Japanese Patent Application Laid-Open No. 2-208355
[Patent Document 10] Japanese Patent Application Laid-Open No. 6-184213
[Patent Document 11] Japanese Patent Application Laid-Open No. 6-179734

DISCLOSURE OF THE INVENTION

Problems to be Solved by the Invention

The inventors of the present invention examined in detail resin compositions using polyphenylene ether and a thermosetting resin in combination, including the resin compositions described in Patent Documents 1 to 11, and their applicability to the applications in the laminates of printed circuit boards.

As a result, the resin compositions disclosed in Patent Document 1, Patent Document 2 and Patent Document 11 exhibited deteriorated dielectric properties after curing under the influence of highly polar epoxy resins or bismaleimide, and thus were unsuitable for the applications involving high frequencies.

The composition using a cyanate ester in combination as disclosed in Patent Document 3 had excellent dielectric properties, but the heat resistance deteriorated after moisture absorption.

The compositions using triallyl cyanurate or triallyl isocyanurate in combination as disclosed in Patent Documents 4 and 5, Patent Document 9 and Patent Document 10 exhibited slightly higher relative permittivities, as well as a tendency that the drift in the dielectric properties concomitant to moisture absorption is large.

The resin compositions using polybutadiene in combination as disclosed in Patent Documents 4 to 7 and Patent Document 10 had excellent dielectric properties, but had problems such as that the strength of the resins themselves was low, or that the thermal expansion coefficient was high. Thus, the resin compositions were inappropriate for the applications in high multilayer printed circuit boards.

Patent Document 8 discloses a resin composition using modified polybutadiene in combination so as to improve the adhesiveness to metals and glass substrates. However, there was a problem that the dielectric properties, particularly in the high frequency region of 1 GHz or more, were largely deteriorated, as compared to the case of using unmodified polybutadiene.

Furthermore, the composition using a reaction product of a polyphenylene ether and an unsaturated carboxylic acid or unsaturated acid anhydride, as disclosed in Patent Document 11, had poor dielectric properties, as compared to the case of using a typical polyphenylene ether, under the influence of a highly polar unsaturated carboxylic acid or unsaturated acid anhydride.

Thus, it is believed that there is a demand for a thermosetting resin composition containing PPE, which has the above-described defects of thermoplasticity improved, and also has excellent dielectric properties.

Furthermore, the inventors of the present invention paid attention to the dielectric properties, and particularly to the lowering of transmission loss, and conducted research. Thus, the inventors found that when only a resin having low permittivity and low dielectric dissipation factor is used, it is insufficient as the countermeasure to the increasingly higher frequencies granted to electric signals in recent years. Since the transmission loss of electric signal is classified as a loss caused by an insulating layer (dielectric loss) and a loss caused by conductive layer (conductor loss), in the case of using a resin having a low dielectric constant and a low dielectric dissipation factor, only the dielectric loss is lowered. In order to further reduce the transmission loss, it is necessary to reduce the conductor loss as well.

As a method for devising this lowering of conductor loss, a method of employing a metal clad laminated board which makes use of a metal foil having less surface unevenness on the side of the roughened surface (hereinafter, referred to as "M surface"), which is the surface adhering a conductor layer and an insulating layer, more specifically, a metal foil having a surface roughness (ten points average roughness; Rz) of 5 μm or less for the M surface (hereinafter, referred to as "low profile foil"), or the like can be used.

Therefore, the inventors of the present invention conducted an investigation on the use of a thermosetting resin having a low dielectric constant and a low dielectric dissipation factor as the material for printed circuit boards for high frequency applications, and a low profile foil as the metal foil.

However, as a result of the research carried out by the inventors, it was found that when the resin compositions described in Patent Documents 1 to 11 are used to produce laminates with low profile foil, the adhesive power (bonding power) between an insulating (resin) layer and a conductor (metal foil) layer is weakened, and thus the required peeling strength cannot be secured. This is conceived to be attributable to the low polarity of the resin, and the lowered anchoring effects attributable to the unevenness of the M surface of the metal foil. Furthermore, in a test for heat resistance after moisture absorption conducted with these laminates, a failure of delamination between the resin and the metal foil occurred. This is conceived to be attributable to the low adhesive power between the resin and the metal foil. From such results, the inventors of the present invention found another problem, in addition to the above-disclosed problems, that it is difficult to apply these resin compositions described in Patent Documents 1 to 11 with metal foil having small surface roughness, such as low profile foil.

In particular, the following was conspicuous in the system of polyphenylene ether and butadiene homopolymer. These resins are immiscible with each other by nature, and can hardly be made into a homogeneous resin. Thus, in the case of directly using resin compositions containing these resins, there is a problem of having tackiness while being in an uncured state, which is a defect of butadiene homopolymer systems, and therefore, a prepreg having uniform external appearance and good workability cannot be obtained. Also, in the case of producing a metal clad laminated board using this prepreg and a metal foil, the resin undergoes curing in a non-uniform state (macro-phase separation state). Thus, in addition to the problem of external appearance, there occurs a decrease in the heat resistance after moisture absorption, and the defects of the butadiene homopolymer system are highlighted, thus various flaws such as low fracture strength or large thermal expansion coefficient occurred.

Furthermore, the peeling strength between the prepreg and the metal foil was also of low level, even without the strength with which low profile foil can be applied. In this regard, it is conceived that low cohesive failure strength of the resin in the area adjacent to the metal foil during peeling-off is affecting as a more major factor, rather than the low interfacial adhesive power between the butadiene homopolymer and the metal foil.

Thus, in an attempt to address the problems described above, it is an object of the present invention to provide a thermosetting resin composition usable in the production of printed circuit boards, which composition has good dielectric properties particularly in high frequency bands, thus being capable of significantly lowering the transmission loss, and has excellent heat resistance after moisture absorption and thermal expansion properties, as well as satisfactory peeling strength from metal foil; and a resin varnish, a prepreg and a metal clad laminated board using the same.

Embodiments of the present invention are not to be defined as inventions which solve all of the problems exhibited in the related art.

Means for Solving the Problems

Japanese Patent Applications Nos. 2006-4067, 2006-1116405 and 2006-246722, all filed by the inventors and applicant of the present invention, are incorporated in the present specification by reference in their entirety for all purposes.

To solve the problems described above, the inventors of the present invention have devotedly and repeatedly conducted research on resin compositions containing polyphenylene ether, and as a result, they achieved a thermosetting resin composition of a semi-IPN composite, comprising a polyphenylene ether and a prepolymer formed from a specific butadiene polymer, which are compatibilized and uncured, the composition being a thermosetting resin composition containing a compatibilized, uncured polyphenylene ether-modified butadiene polymer produced by a novel and unique method of compatibilization. The inventors also found that when this resin composition is used for the applications in printed circuit boards, the resin composition has good dielectric properties in high frequency bands and excellent properties of lowering transmission loss, and can exhibit good heat resistance after moisture absorption and a low thermal expansion coefficient. The inventors also found that since this resin composition has high peeling strength from metal foil, the resin composition can be applied even to a metal foil having small surface roughness, such as low profile foil in particular, thus establishing the present invention.

Thus, the present invention relates to a thermosetting resin composition of a semi-IPN composite, comprising (A) a polyphenylene ether, and a prepolymer formed from (B) a butadiene polymer which is not chemically modified and contains 40% or more of a 1,2-butadiene unit having a 1,2-vinyl group in a side chain of a molecule and (C) a crosslinking agent, the polyphenylene ether and the prepolymer being in a compatibilized and uncured state.

The present invention also relates to a thermosetting resin composition of a semi-IPN composite, the semi-IPN composite comprising a radical polymerizable polymer formed by radical polymerization of (A) a polyphenylene ether, (B) a butadiene polymer and (C) a crosslinking agent, wherein
component (B) is a butadiene polymer which is not chemically modified and contains (j) a —[CH$_2$—CH=CH—CH$_2$]— unit and (k) a —[CH$_2$—CH(CH=CH$_2$)]— unit, with the ratio of j:k being from 60:40 to 5:95; and
component (C) is a compound having one or more ethylenically unsaturated double bonds in a molecule.

The present invention relates to a thermosetting resin composition of an uncured semi-IPN composite, comprising a polyphenylene ether-modified butadiene prepolymer obtained by preliminarily-reacting (B) a butadiene polymer which is not chemically modified and contains 40% or more of a 1,2-butadiene unit having a 1,2-vinyl group in a side chain of a molecule, with (C) a crosslinking agent, in the presence of (A) a polyphenylene ether.

The present invention also relates to a resin composition comprising a polyphenylene ether-modified butadiene prepolymer obtained by preliminarily-reacting (B) a butadiene polymer which is not chemically modified and contains 40% or more of a 1,2-butadiene unit having a 1,2-vinyl group in a side chain of a molecule, with (C) a crosslinking agent, in the presence of (A) a polyphenylene ether, so that a conversion rate of component (C) is in the range of 5 to 100%, and preferably 5 to 80%.

The present invention relates to a resin composition wherein the component (C) contains at least one maleimide compound represented by the formula (1):

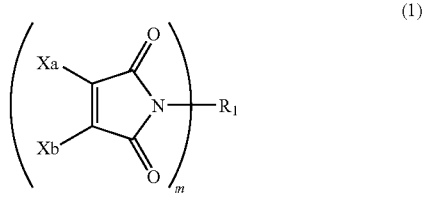

(1)

wherein R$_1$ is an aliphatic or aromatic organic group having a valence of m;

Xa and Xb, which may be identical or different from each other, each is a monovalent atom or organic group selected from a hydrogen atom, a halogen atom and an aliphatic organic group; and
m represents an integer of 1 or greater.

The present invention relates to a resin composition, wherein the component (C) is at least one maleimide compound selected from the group consisting of N-phenylmaleimide, N-(2-methylphenyl)maleimide, N-(4-methylphenyl)maleimide, N-(2,6-dimethylphenyl)maleimide, N-(2,6-diethylphenyl)maleimide, N-(2-methoxyphenyl)maleimide, N-benzylmaleimide, N-dodecylmaleimide, N-isopropylmaleimide and N-cyclohexylmaleimide.

The present invention relates to a resin composition, wherein the component (C) is at least one maleimide compound containing 2,2-bis(4-(4-maleimidophenoxy)phenyl)propane.

The present invention relates to a resin composition wherein the component (C) is at least one maleimide compound containing bis(3-ethyl-5-methyl-4-maleimidophenyl)methane.

The present invention relates to a resin composition, wherein the component (C) is at least one vinyl compound containing divinylbiphenyl.

The present invention relates to a resin composition, wherein a mixing proportion of the component (A) is in the range of 2 to 200 parts by weight based on 100 parts by weight of the total amount of the component (B) and component (C), and a mixing proportion of the component (C) is in the range of 2 to 200 parts by weight based on 100 parts by weight of the component (B).

The present invention also relates to a resin composition, further comprising (D) a radical reaction initiator.

The present invention relates to a resin composition, further comprising (E) a crosslinkable monomer or crosslinkable polymer which does not constitute the uncured semi-IPN composite and contains one or more groups having an ethylenically unsaturated double bond in a molecule.

The present invention relates to a resin composition, wherein the component (E) is a crosslinkable monomer or crosslinkable polymer containing at least one group having an ethylenically unsaturated double bond, selected from the group consisting of a chemically unmodified butadiene polymer, a maleimide compound and a styrene-butadiene copolymer.

The present invention relates to a resin composition, further comprising (F) at least any one of a bromine-based flame retardant and a phosphorus-based flame retardant.

The present invention relates to a resin composition, further comprising (G) an inorganic filler.

The present invention relates to a resin varnish for printed circuit boards obtained by dissolving or dispersing the above-mentioned resin composition in a solvent.

The present invention relates to a prepreg obtained by impregnating the resin varnish into a substrate for printed circuit boards, and then drying the impregnated prepreg.

The present invention relates to a metal clad laminated board obtained by stacking one sheet or more of the prepreg for printed circuit boards, disposing metal foil on one side or both sides of the stacked prepreg, and pressing them together while heating.

EFFECTS OF THE INVENTION

According to the present invention, a printed circuit board using the resin composition and the like of the present invention can achieve excellent high frequency properties and good heat resistance after moisture absorption or low thermal expansion properties. Furthermore, a resin composition achieving the peeling strength between the resin composition and metal foil to a sufficiently high level, and a resin varnish, a prepreg and a metal clad laminated board using the same can be provided. Therefore, the resin composition and the like of the present invention are useful for the applications in members and elements of printed circuit boards that are used in various electric and electronic devices, such as mobile telecommunication devices dealing with signals of high frequencies of 1 GHz or greater, or devices for the base stations, network-associated electronic devices such as servers and routers, and large scale computers.

BEST MODE FOR CARRYING OUT THE INVENTION

Hereinafter, suitable embodiments of the present invention will be described in detail.

The reason why the thermosetting resin composition of a novel semi-IPN composite of the present invention can achieve the above-described objects has not been clarified in detail. The inventors of the present invention have arrived at the following presumption, but do not intend to exclude the possible involvement of other factors.

The present invention aims at significantly enhancing dielectric properties by containing polyphenylene ether which is a thermoplastic resin having good dielectric properties, and a chemically unmodified butadiene polymer, which is known as one of the thermosetting resins exhibiting the most excellent dielectric properties, as the essential components. As discussed in the above, polyphenylene ether and a chemically unmodified butadiene polymer are originally immiscible with each other, and it is difficult to blend them into a homogeneous resin. However, a homogeneously compatibilized resin with a novel constitution can be obtained by a technique of using the preliminary reaction of the present invention.

In the present invention, the preliminary reaction involves generating radicals at a reaction temperature of, for example, 60 to 170° C. to allow reaction between the component (B) and the component (C), and a predetermined amount of the material from the component (B) undergoes crosslinking, while a predetermined amount of the component (C) is converted. That is, this state is an uncured state which has not reached gelation. A mixture of the component (A), the component (B) and the component (C) before and after this preliminary reaction, and a semi-IPN polymer can be easily distinguished on the basis of viscosity, turbidity, and changes in the characteristic peaks in liquid chromatography.

In addition, a so-called curing reaction in general is to cure by pressing while heating or to cure by generating radicals at a temperature above the volatilization temperature of a solvent, and thus is obviously different from the preliminary reaction according to the present invention.

In the present invention, the chemically unmodified butadiene polymer of the component (B) containing 40% or more of a 1,2-butadiene unit having a 1,2-vinyl group in the side chain in the molecule and the crosslinking agent of the component (C) are subjected to a preliminary reaction at an appropriate conversion rate (reaction rate) in the presence of the polyphenylene ether of the component (A), to obtain a polyphenylene ether-modified butadiene prepolymer in which a so-called "semi-IPN" is formed between one part of a linear polymer component (herein, the component (A), solid lines) and the other part of a crosslinkable component (herein, the components (B) and (C), dotted lines), in an uncured state of before complete curing, and thus a homogeneous resin composition is obtained (thermosetting resin composition of an uncured semi-IPN composite; see the following diagram). It is conceived that homogenization (compatibilization) in this case is not related to forming chemical bonds between the component (A) and the other component (partial crosslinking product between the component (B) and the component (C)), but is related to oligomerization resulting from partial and physical mutual entanglement of the molecular chains of the component (A) and the other component. Therefore, it is conceived that the components form a microphase-separated structure, and can be apparently homogenized (compatibilized).

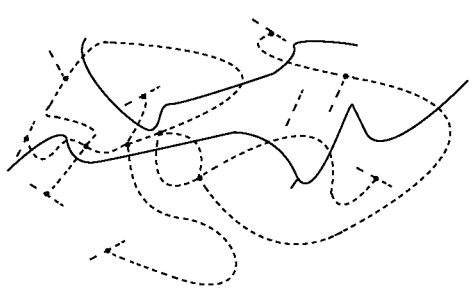

A resin composition containing this polyphenylene ether-modified butadiene prepolymer (thermosetting resin composition of an uncured semi-IPN composite) can yield a resin film having an apparently uniform external appearance. A polyphenylene ether-modified butadiene prepolymer, such as one conventionally known, does not form semi-IPN per se, and the constituent components thereof are not compatibilized. Therefore, the polymer can be said to be in a phase-separation state. For that reason, the polymer is different from the composition of the present invention, and a conventional polyphenylene ether-modified butadiene prepolymer undergoes macro-phase separation which appears inhomogeneous.

A prepreg produced using the resin composition containing a polyphenylene ether-modified butadiene prepolymer of the present invention (thermosetting resin composition of an uncured semi-IPN composite) has a uniform external appearance, and since a butadiene prepolymer which is crosslinked to a certain extent, and polyphenylene ether which is originally non-tacky, are in a state of being compatibilized at the molecular level, the problem of tackiness is eliminated. Furthermore, a metal clad laminated board produced using this prepreg has no problem in the external appearance as in the case of the prepreg, and since curing occurs while the molecular chains are partially and physically entangled with each other, the pseudo-crosslinking density becomes higher than that in the case of curing a resin composition in a non-homogeneous state. Thus, elasticity is increased, and the thermal expansion coefficient is lowered. The increase in elasticity and the formation of a uniform microphase-separated structure can bring forth a large increase in the fracture strength or heat resistance (particularly, after moisture absorption) of the resin. Furthermore, the increase in the fracture strength of the resin can lead to the manifestation of a metal foil peeling strength as high as to a level where low profile foil can be applied. Also, it was found that when a specific crosslinking agent which would impart features such as increasing the resin strength or toughness when the resin is cured, or restraining molecular movement, is selected as the component (C), the metal foil peeling strength and the thermal expansion properties can be enhanced to higher levels.

The novel thermosetting resin composition of a semi-IPN composite of the present invention contains a polyphenylene ether-modified butadiene prepolymer obtained by preliminarily-reacting a butadiene homopolymer of component (B) containing 40% or more of a 1,2-butadiene unit having a 1,2-vinyl group in a side chain of a molecule, and a crosslinking agent of component (C), in the presence of a polyphenylene ether of component (A). Hereinafter, various components of the resin composition and a suitable method for producing the polyphenylene ether-modified butadiene prepolymer will be discussed.

In the novel thermosetting resin composition of a semi-IPN composite of the present invention, the component (A) used in the production of the polyphenylene ether-modified butadiene prepolymer may be exemplified by poly(2,6-dimethyl-1,4-phenylene) ether or poly(2,3,6-trimethyl-1,4-phenylene) ether obtained by homopolymerization of 2,6-dimethylphenol or 2,3,6-trimethylphenol, a copolymer of 2,6-dimethylphenol and 2,3,6-trimethylphenol, or the like. An alloying polymer of one of the foregoing polymers with polystyrene, a styrene-butadiene copolymer or the like, that is, a so-called modified polyphenylene ether, can also be used. However, in this case, a polymer containing 50% or more of the component of poly(2,6-dimethyl-1,4-phenylene) ether, the component of poly(2,3,6-trimethyl-1,4-phenylene) ether, or the component of copolymer of 2,6-dimethylphenol and 2,3,6-trimethylphenol, is more preferred.

The molecular weight of the component (A) is not particularly limited, but in consideration of the balance between the dielectric properties or heat resistance when the resin composition is used in printed circuit boards, and the fluidity of resin when the resin composition is used in prepregs, it is preferable that the number average molecular weight is in the range of 7000 to 30000. In addition, the number average molecular weight as used herein is a value obtained by performing a measurement by gel permeation chromatography, and calculated on the basis of calibration curve constructed using standard polystyrene.

The component (B) used in the production of a polyphenylene ether-modified butadiene prepolymer in the present invention is not particularly limited, as long as it is a butadiene polymer which contains 40% or more of a 1,2-butadiene unit having a 1,2-vinyl group in the side chain in the molecule, and is not chemically modified. The butadiene polymer is not a modified polybutadiene in which the 1,2-vinyl group in the side chain, or one or both of the terminals in the molecule is chemically modified to be converted to epoxy, glycol, phenol, maleic acid, (meth)acryl, urethane or the like, and is essentially a non-modified butadiene polymer. When a modified polybutadiene is used, the dielectric properties, moisture resistance and heat resistance are deteriorated, and thus it is not desirable.

The content of the 1,2-butadiene unit having a 1,2-vinyl group in the side chain in a molecule of the component (B) is preferably 50% or more, and more preferably 65% or more, from the viewpoint of the curability of the resin composition. The number average molecular weight of the component (B) is preferably in the range of 500 to 10,000. If the number average molecular weight is larger than 10,000, fluidity of the resin is deteriorated when the resin composition is used in prepregs, and thus it is not preferable. If the number average molecular weight is less than 500, curability of the resin composition or the dielectric properties obtained when the resin composition is cured are deteriorated, and thus it is not preferable. Considering the balance between the curability of the resin composition or the dielectric properties obtained when the resin composition is cured, and the fluidity of resin when the resin composition is used in prepregs, the number average molecular weight is more preferably in the range of 700 to 8000, and even more preferably in the range of 1000 to 5000. Additionally, the number average molecular weight has the same definition as described with regard to the component (A).

As the component (B), a chemically unmodified butadiene polymer comprising a —[CH$_2$—CH=CH—CH$_2$]— unit (j) and a —[CH$_2$—CH(CH=CH$_2$)]— unit (k), with a ratio of j:k being 60 to 5:40 to 95, can be used.

Specific examples of the component (B) suitably used in the present invention include B-1000, B-2000, B-3000 (manufactured by Nippon Soda Co., Ltd., trade name), B-1000, B-2000, B-3000 (manufactured by Nippon Petrochemicals Co., Ltd., trade name), Ricon142, Ricon150, Ricon152, Ricon153, Ricon154 (manufactured by Sartomer Company, trade name), and the like are commercially available.

The component (C) used in the production of the polyphenylene ether-modified butadiene prepolymer in the present invention is a compound having a functional group which is reactive to the component (B) in the molecule, and for example, a crosslinkable monomer or crosslinkable polymer containing one or more groups having an ethylenically unsaturated double bond in the molecule may be mentioned. Specific examples of the component (C) include vinyl compounds, maleimide compounds, diallyl phthalate, (meth)acryloyl compounds, unsaturated polyesters, styrene-butadiene copolymers and the like. Among these, the component (C) that can be suitably used may include at least one maleimide compound or at least one vinyl compound, since these compounds are desirable from the viewpoints that the compounds enhance the curability or storage stability of a resin composition containing the compounds because they have excellent co-crosslinkability with the component (B), and that the total balance of molding property, dielectric properties, dielectric properties after moisture absorption, thermal expansion properties, metal foil peeling strength, Tg, heat resistance after moisture absorption, and flame resistance is excellent when the resin composition is used in printed circuit boards.

The maleimide compound that can be suitably used as the component (C) of the present invention is not particularly limited, as long as it is a compound containing one or more maleimide groups in the molecule represented by the following formula (1). A monomaleimide compound or a polymaleimide compound represented by the following formula (2) can be suitably used.

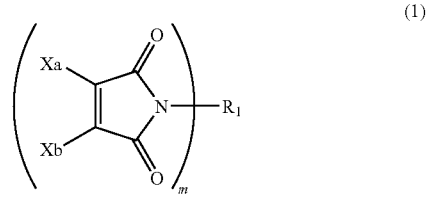

(1)

wherein R$_2$ is a monovalent or polyvalent organic group having a valence of m, and being any one of aliphatic, alicyclic, aromatic and heterocyclic; Xa and Xb, which may be identical or different from each other, each is a monovalent atom or organic group selected from a hydrogen atom, a halogen atom and an aliphatic organic group; and m represents an integer of 1 or greater.

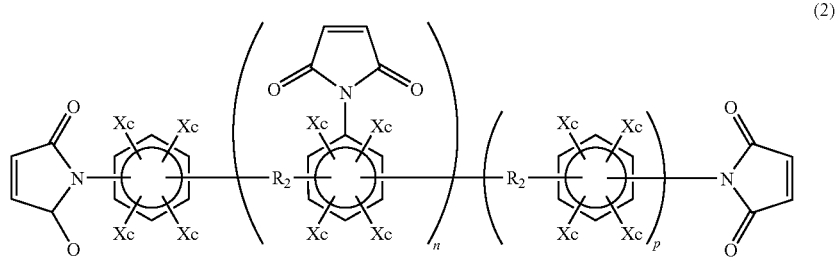

(2)

wherein $R_2$ is —C(Xc)$_2$—, —CO—, —O—, —S—, —SO$_2$— or a linking bond, while a plurality of $R_2$ may be identical with or different from each other; Xc represents an alkyl group having 1 to 4 carbon atoms, —CF$_3$, —OCH$_3$, —NH$_2$, a halogen atom or a hydrogen atom, while a plurality of Xc may be identical with or different from each other, and their positions of substitution on the benzene ring is independent of each other; and n and p each represent an integer from 0 to 10.

Specific examples of the above-mentioned monomaleimide compound include N-phenylmaleimide, N-(2-methylphenyl)maleimide, N-(4-methylphenyl)maleimide, N-(2,6-dimethylphenyl)maleimide, N-(2,6-diethylphenyl)maleimide, N-(2-methoxyphenyl)maleimide, N-benzylmaleimide, N-dodecylmaleimide, N-isopropylmaleimide, N-cyclohexylmaleimide and the like.

Specific examples of the polymaleimide compound represented by the formula (2) include 1,2-dimaleimidoethane, 1,3-dimaleimidopropane, bis(4-maleimidophenyl)methane, bis(3-ethyl-4-maleimidophenyl)methane, bis(-ethyl-5-methyl-4-maleimidophenyl)methane, 2,7-dimaleimidofluorene, N,N'-(1,3-phenylene)bismaleimide, N,N'-(1,3-(4-methylphenylene))bismaleimide, bis(4-maleimidophenyl)sulfone, bis(4-maleimidophenyl)sulfide, bis(4-maleimidophenyl)ether, 1,3-bis(3-maleimidophenoxy)benzene, 1,3-bis(3-(3-maleimidophenoxy)phenoxy)benzene, bis(4-maleimidophenyl) ketone, 2,2-bis(4-(4-maleimidophenoxy)phenyl)propane, bis(4-(4-maleimidophenoxy)phenyl)sulfone, bis[4-(4-maleimidophenoxy)phenyl]sulfoxide, 4,4'-bis(3-maleimidophenoxy)biphenyl, 1,3-bis(2-(3-maleimidophenyl)propyl)benzene, 1,3-bis(1-(4-(3-maleimidophenoxy)phenyl)-1-propyl)benzene, bis(maleimidocyclohexyl)methane, 2,2-bis[4-(3-maleimidophenoxy)phenyl]-1,1,1,3,3,3-hexafluoropropane, bis(maleimidophenyl)thiophene, aliphatic, alicyclic, aromatic and heterocyclic polymaleimides represented by the following formula (3) and the following formula (4), and the like (provided that they include their respective isomers). From the viewpoints of moisture resistance, heat resistance, fracture strength, metal foil peeling strength and low thermal expansion properties obtained when the resin composition is used in printed circuit boards, an aromatic polymaleimide is preferred, and among them, it is more preferable to use bis(3-ethyl-5-methyl-4-maleimidophenyl)methane from the viewpoint of further lowering the thermal expansion coefficient in particular, and it is more preferable to use 2,2-bis(4-(4-maleimidophenoxy)phenyl)propane from the viewpoint of further increasing the fracture strength and metal foil peeling strength. Furthermore, a monomaleimide allowing a mild curing reaction is preferred from the viewpoint of increasing the molding property when the resin composition is used in prepregs, and among them, it is more preferable to use N-phenylmaleimide from the viewpoint of costs. The maleimide compounds may be used individually, or in combination of two or more species. Also, at least one of these maleimide compounds and one or more of the crosslinking agents shown in the above may be used in combination.

In the case of using a maleimide compound and another crosslinking agent in combination as the component (C), the proportion of the maleimide compound in the component (C) is preferably 50% by weight or more, and more preferably 80% by weight or more. However, it is more preferable to use maleimide compounds alone, rather than to use with other crosslinking agents in combination.

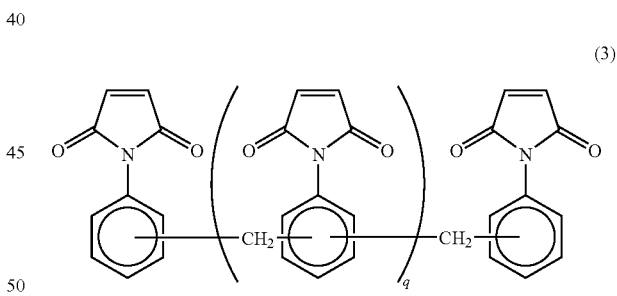

(3)

wherein q is from 0 to 10 as an average value.

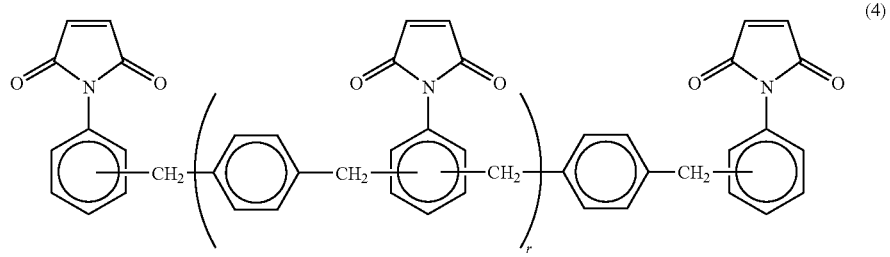

(4)

wherein r is from 0 to 10 as an average value.

The vinyl compound that can be suitably used as the component (C) may be exemplified by styrene, divinylbenzene, vinyltoluene or divinylbiphenyl. Divinylbiphenyl is preferred.

As a specific example of the component (B) that can be suitably used in the present invention, divinylbiphenyl (manufactured by Nippon Steel Chemical Co., Ltd.) is commercially available.

The polyphenylene ether-modified butadiene prepolymer in the novel thermosetting resin composition of a semi-IPN composite of the present invention is produced by preliminarily-reacting the component (B) with the component (C) in the presence of the component (A), that is preferably spread in a medium, to the extent that gelation does not occur. Then, there is formed a semi-IPN polymer in which molecular chains are physically entangled with each other in a system of the component (A), component (B) and component (C), which is originally an immiscible system, and a prepolymer that is homogeneous in the external appearance (compatibilized) is obtained in an uncured state which is a stage before the completely cured state.

According to the present invention, the prepolymer can be produced by, for example, spreading the component (A) in a medium by dissolving the component (A) in a solvent or the like, subsequently dissolving or dispersing the component (B) and the component (C) in this solution, and heating and stirring the resultant at 60 to 170° C. for 0.1 to 20 hours. In the case of producing polyphenylene ether-modified butadiene prepolymer in a solution, it is preferable to adjust the amount of use of the solvent so that the concentration of solids (involatile fraction) in the solution reaches typically 5 to 80% by weight. Then, after producing the polyphenylene ether-modified butadiene prepolymer, the solvent may be completely removed by concentration or the like to obtain a solventless resin composition, or the prepolymer may be directly dissolved or dispersed in a solvent to obtain a polyphenylene ether-modified butadiene prepolymer solution. Also, in the case of preparing a solution, the solution may have the concentration of solids (involatile fraction) increased by concentration or the like.

The mixing proportions of the component (A), component (B) and component (C) used in the production of polyphenylene ether-modified butadiene prepolymer, in the resin composition of the present invention, are determined such that the mixing proportion of the component (A) is in the range of 2 to 200 parts by weight, more preferably 10 to 100 parts by weight, and even more preferably 15 to 50 parts by weight, based on 100 parts by weight of the total amount of the component (B) and the component (C). The mixing proportion of the component (A) is preferably mixed based on 100 parts by weight of the total amount of the component (B) and the component (C), in consideration of the balance between the coating workability attributable to thermal expansion coefficient, dielectric properties, and the viscosity of the resin varnish, and the molding property in the case of using the resin composition in printed circuit boards, which is attributable to the melt viscosity obtained when the resin composition is used in prepregs. Furthermore, the mixing proportion of the component (C) is preferably in the range of 2 to 200 parts by weight, more preferably 5 to 100 parts by weight, and even more preferably 10 to 75 parts by weight, based on 100 parts by weight of the component (B). The mixing proportion of the component (C) is preferably mixed based on 100 parts by weight of the component (B), in consideration of the balance between thermal expansion coefficient, Tg and metal foil peeling strength, and the dielectric properties.

The polyphenylene ether-modified butadiene prepolymer of the present invention is obtained by preliminarily-reacting the components so that a conversion rate (reaction rate) of the component (C) falls in the range of 5 to 100% during the production of the prepolymer. A more preferred range may vary with the mixing proportions of the component (B) and the component (C). Thus, when the mixing proportion of the component (C) is in the range of 2 to 10 parts by weight based on 100 parts by weight of the component (B), the conversion rate (reaction rate) of the component (C) is more preferably in the range of 10 to 100%; when the mixing proportion is in the range of 10 to 100 parts by weight, the conversion rate (reaction rate) of the component (C) is more preferably in the range of 7 to 90%; and when the proportion is in the range of 100 to 200 parts by weight, the conversion rate (reaction rate) of the component (C) is more preferably in the range of 5 to 80%. The conversion rate (reaction rate) of the component (C) is preferably 5% or more, from the viewpoints of uniform external appearance and non-tackiness in the case of a resin composition or a prepreg, and from the viewpoint of heat resistance after moisture absorption, metal foil peeling strength or thermal expansion coefficient in the case of a printed circuit board.

In addition, the polyphenylene ether-modified butadiene prepolymer according to the present invention includes a state in which the component (C) is 100% converted. The prepolymer also includes a state in which a conversion of the component (C) is less than 100%, and unreacted, unconverted component (C) is remaining.

The conversion rate (reaction rate) of the component (C) is a value calculated on the basis of the residual amount of the component (C) in the polyphenylene ether-modified butadiene prepolymer measured by gel permeation chromatography, and a calibration curve for the component (C) constructed in advance.

It is preferable, for the purpose of initiating or accelerating the preliminary reaction between the component (B) and the component (C) during the production of polyphenylene ether-modified butadiene prepolymer, and for the purpose of initiating or accelerating the curing reaction of the resin composition during the production of metal clad laminated boards or multilayer printed circuit boards, that the resin composition of the present invention contains (D) a radical reaction initiator.

Specific examples of the component (D) include, but not limited to, peroxides such as dicumyl peroxide, t-butylcumyl peroxide, benzoyl peroxide, cumene hydroperoxide, 1,1-bis(t-hexylperoxy)-3,3,5-trimethylcyclohexane, 1,1-bis(t-butylperoxy)-2-methylcyclohexane, 1,1-bis(t-hexylperoxy)cyclohexane, 1,1-bis(t-butylperoxy)cyclohexane, 2,2-bis(4,4-di(t-butylperoxy)cyclohexyl)propane, 2,5-dimethylhexane-2,5-dihydroperoxide, 2,5-dimethyl-2,5-bis(t-butylperoxy)hexyne-3, di-t-butylperoxide, 1,1'-bis(t-butylperoxy)diisopropylbenzene, 2,5-dimethyl-2,5-bis(t-butylperoxy)hexane, di-t-butyl peroxyisophthalate, t-butyl peroxybenzoate, t-butyl peroxyacetate, 2,2-bis(t-butylperoxy)butane, 2,2-bis(t-butylperoxy)octane, 2,5-dimethyl-2,5-di(benzoylperoxy)hexane, bis(t-butylperoxy)isophthalate, isobutyryl peroxide, di(trimethylsilyl) peroxide and trimethylsilyl triphenylsilyl peroxide; 2-hydroxy-2-methyl-1-phenylpropan-1-one, 1-(4-isopropylphenyl)-2-hydroxy-2-methylpropan-1-one, benzoin methyl ether, methyl-O-benzoyl benzoate, and the like.

It is also preferable for the component (D) to incorporate those used for the purpose of initiating or accelerating the preliminary reaction during the production of polyphenylene ether-modified butadiene prepolymer, and those used for the purpose of initiating or accelerating the curing reaction after the production of polyphenylene ether-modified butadiene prepolymer, in divided portions before and after the production of the polyphenylene ether-modified butadiene prepolymer. In that case, for the component (D) incorporated for each of the purposes, compounds of the same type may be used, or compounds of different types may be used. Also, a single species may be used individually alone, or a mixture of two or more species may be used.

The mixing proportion of the component (D) in the resin composition of the present invention can be determined in accordance with the mixing proportions of the component (B) and the component (C), and is preferably 0.05 to 10 parts by weight based on 100 parts by weight of the total amount of the component (B) and the component (C). When the radical reaction initiator of the component (D) is incorporated within this value range, an appropriate reaction speed is obtained for the preliminary reaction during the production of the polyphenylene ether-modified butadiene prepolymer, and good curability is obtained for the curing reaction during the production of metal clad laminated boards or multilayer printed circuit boards.

Furthermore, the resin composition of the present invention may be further incorporated with, if necessary, (E) a crosslinkable monomer or crosslinkable polymer containing one or more groups having an ethylenically unsaturated double bond in the molecule, which does not constitute uncured semi-IPN composite; (F) a flame retardant; (G) an inorganic filler; and various thermosetting resins; various thermoplastic resins; and various additives. The mixing amounts of these materials are preferably set within the range of not deteriorating the properties such as the dielectric properties, heat resistance, adhesiveness (metal foil peeling strength, adhesiveness to substrates of glass and the like), moisture resistance, Tg and thermal expansion properties when the resin composition is used in printed circuit boards.

The crosslinkable monomer or crosslinkable polymer containing one or more groups having an ethylenically unsaturated double bond in the molecule, which does not constitute uncured semi-IPN composite of the component (E) is not particularly limited. Specifically, the crosslinkable monomer or crosslinkable polymer is selected from the group consisting of chemically unmodified butadiene polymers, maleimide compounds and styrene-butadiene copolymers. The compounds mentioned as the component (B) and the component (C) can be used, as long as they do not constitute uncured semi-IPN composite. Furthermore, as the chemically unmodified butadiene polymer, there may be mentioned a butadiene polymer which has a number average molecular weight of greater than 10,000, and is not chemically modified. These compounds may be used individually alone, or may be used as mixtures of two or more species.

In the case where the same compounds as those mentioned as the component (B) and the component (C) are incorporated as the component (E), the compounds are incorporated after the production of the thermosetting resin composition of an uncured semi-IPN composite (polyphenylene ether-modified butadiene prepolymer), and the mixing amount of the component (E) in that case is distinguished from the mixing amounts of the component (B) and component (C), and preferred mixing amounts thereof are separately described below. In the case where the same compounds as those mentioned as the component (B) and component (C) are incorporated as the component (E), the same species as those used in the production of the polyphenylene ether-modified butadiene prepolymer may be used, or compounds of different kinds may also be used.

In the case of incorporating a styrene-butadiene copolymer as the component (E), the copolymer can be used in the form of rubber as well as in the form of elastomer, and the copolymer is not particularly limited in terms of the molecular weight, copolymerization ratio of styrene and butadiene, and the ratio of 1,2-vinyl bond and the ratio of 1,4-bond in the butadiene unit. Furthermore, in the case of incorporating, as the component (E), a butadiene polymer which has a number average molecular weight of greater than 10,000 and is not chemically modified, the polymer can be used in the form of liquid as well as in the form of solid, and also is not particularly limited in terms of the ratio of 1,2-vinyl bond and the ratio of 1,4-bond.

The mixing proportion of the component (E) in the resin composition of the present invention is not particularly limited, but is preferably 2 to 100 parts by weight, more preferably 2 to 80 parts by weight, and even more preferably 2 to 60 parts by weight, based on 100 parts by weight of the total amount of the component (A), component (B) and component (C).

The flame retardant of the component (F) is not particularly limited, but bromine-based, phosphorus-based, and metal hydroxide-based flame retardants, and the like are suitably used. More specifically, examples of the bromine-based flame retardants include brominated epoxy resins such as brominated bisphenol A epoxy resins and brominated phenol novolac epoxy resins; brominated addition type flame retardants such as hexabromobenzene, pentabromotoluene, ethylenebis(pentabromophenyl), ethylenebistetrabromophthalimide, 1,2-dibromo-4-(1,2-dibromoethyl)cyclohexane, tetrabromocyclooctane, hexabromocyclododecane, bis(tribromophenoxy)ethane, brominated polyphenylene ether, brominated polystyrene and 2,4,6-tris(tribromophenoxy)-1,3,5-triazine; brominated reactive flame retardants containing a group having an unsaturated double bond, such as tribromophenylmaleimide, tribromophenyl acrylate, tribromophenyl methacrylate, tetrabromobisphenol A dimethacrylate, pentabromobenzyl acrylate and styrene bromide; and the like.

Examples of the phosphorus-based flamed retardants include aromatic phosphoric acid esters such as triphenyl phosphate, tricresyl phosphate, trixylenyl phosphate, cresyl diphenyl phosphate, cresyl di-2,6-xylenyl phosphate and resorcinol bis(diphenyl phosphate); phosphoric acid esters such as divinyl phenylphosphonate, diallyl phenylphosphonate and bis(1-butenyl)phenylphosphonate; phosphinic acid esters such as phenyl diphenylphosphinate, methyl diphenylphosphinate, 9,10-dihydro-9-oxa-10-phosphaphenanthrene-10-oxide derivatives; phosphagen compounds such as bis(2-allylphenoxy)phosphagen, dicresylphosphagen; and phosphorus-based flame retardants such as melamine phosphate, melamine pyrrolate, melamine polyphosphate, melam polyphosphate, ammonium polyphosphate, phosphorus-containing vinylbenzyl compounds and red phosphorus. Examples of the metal hydroxide flame retardants include magnesium hydroxide, aluminum hydroxide and the like. The above-mentioned flame retardants may be used individually alone, or may also be used in combination of two or more species.

The mixing proportion of the component (F) in the resin composition of the present invention is not particularly limited, but is preferably 5 to 200 parts by weight, more preferably 5 to 150 parts by weight, and even more preferably 5 to 100 parts by weight, based on 100 parts by weight of the total amount of the component (A), component (B) and component (C). If the mixing proportion of the flame retardant is less than 5 parts by weight, flame resistance tends to be insufficient. If the mixing proportion exceeds 200 parts by weight, heat resistance or metal foil peeling strength tends to decrease when the resin composition is used in printed circuit boards.

The inorganic filler of the component (G) is not particularly limited, but specifically, alumina, titanium oxide, mica, silica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay such as calcined clay, talc, aluminum borate, aluminum borate, silicon carbide and the like are used. These inorganic fillers may be used alone, or may also be used in combination of two or more species. The shape and particle size of the inorganic filler also are not particularly limited, and those having a particle size of typically 0.01 to 50 μm, and preferably 0.1 to 15 μm, are suitably used.

The mixing proportion of the component (G) in the resin composition of the present invention is not particularly limited, but is preferably 1 to 1000 parts by weight, and more preferably 5 to 500 parts by weight, based on 100 parts by weight of the total amount of the component (A), component (B) and component (C).

According to the present invention, the solvent is not particularly limited, but specific examples thereof include alcohols such as methanol, ethanol and butanol; ethers such as ethyl cellosolve, butyl cellosolve, ethylene glycol monomethyl ether, carbitol and butyl carbitol; ketones such as acetone, methyl ethyl ketone, methyl isobutyl ketone and cyclohexanone; aromatic hydrocarbons such as toluene, xylene and mesitylene; esters such as methoxyethyl acetate, ethoxyethyl acetate, butoxyethyl acetate and ethyl acetate; nitrogen-containing solvents such as N,N-dimethylformamide, N,N-dimethylacetamide and N-methyl-2-pyrrolidone; and the like. These may be used individually alone, or may also be used in combination of two or more species. Aromatic hydrocarbons such as toluene, xylene and mesitylene, or solvent mixtures of aromatic hydrocarbons and ketones such as acetone, methyl ethyl ketone, methyl isobutyl ketone and cyclohexanone, are more preferred. In the case of using a solvent mixture of aromatic hydrocarbons and ketones among these solvents, the mixing proportion of the ketone is preferably 5 to 100 parts by weight, more preferably 10 to 80 parts by weight, and even more preferably 15 to 60 parts by weight, based on 100 parts by weight of the aromatic hydrocarbon.

Furthermore, the various thermosetting resins incorporated into the resin composition of the present invention as necessary are not particularly limited, but specific examples thereof include epoxy resins, cyanate ester resins, phenol resins, urethane resins, melamine resins, benzoxazine resins, benzocyclobutene resins, dicyclopentadiene resins and the like. Their curing agents or curing accelerating agents may also be used. The various thermoplastic resins incorporated as necessary are not particularly limited, but specific examples thereof include polyolefins such as polyethylene, polypropylene, polybutene, ethylene-propylene copolymers and poly (4-methylpentene), and derivatives thereof; polyesters and derivatives thereof; polycarbonates, polyacetals, polysulfones, (meth)acrylic acid ester copolymers, polystyrene, acrylonitrile styrene copolymers, acrylonitrile styrene butadiene copolymers, polyvinyl acetals, polyvinyl butyrals, polyvinyl alcohols; full or partial hydrogenation products of styrene-butadiene copolymers; full or partial hydrogenation products of polybutadiene; liquid crystalline polymers such as polyether sulfones, polyether ketones, polyether imides, polyphenylene sulfite, polyamideimide, polyamides, thermoplastic polyimides and aromatic polyesters; and the like. The various additives are not particularly limited, but specific examples thereof include silane coupling agents, titanate coupling agents, antioxidants, thermal stabilizers, antistatic agents, ultraviolet absorbents, pigments, colorants, lubricants and the like. These various thermosetting resins, various thermoplastic resins and various additives may be respectively used individually, or may also be used in combination of two or more species.

As one method for producing the resin composition of the present invention, a polyphenylene ether-modified butadiene prepolymer obtained from the component (A), component (B) and component (C); (D) a radical reaction initiator; and (E) a crosslinkable monomer or crosslinkable polymer which contains one or more groups having an ethylenically unsaturated double bond in the molecule, and does not constitute uncured semi-IPN composite; (F) a flame retardant; (G) an inorganic filler, which are optionally incorporated; and various thermosetting resins, various thermoplastic resins; and various additives are incorporated, stirred and mixed by a known method, to produce the resin composition.

The resin varnish can be obtained by dissolving or dispersing the above-described resin composition of the present invention in a solvent. Further, when the polyphenylene ether-modified butadiene prepolymer is produced in a solution, first, the solvent may be removed, and the solventless polyphenylene ether-modified butadiene prepolymer and the above-described other agents to be incorporated may be dissolved or dispersed in a solvent to obtain a resin varnish. A resin varnish may also be obtained by further incorporating the component (D), and optionally, the component (E), component (F), component (G) and the above-described other agents to be incorporated, and if necessary, additional solvent, to the polyphenylene ether-modified butadiene prepolymer solution.

The solvent used in preparing the above-described resin composition into a varnish is not particularly limited, but as specific examples or preferred examples of the solvent, those described with regard to the solvent used in the production of the polyphenylene ether-modified butadiene prepolymer can be used. These may be used individually alone, or may also be used in combination of two or more species. Aromatic hydrocarbons such as toluene, xylene and mesitylene, or solvent mixtures of the aromatic hydrocarbons and ketones such as acetone, methyl ethyl ketone, methyl isobutyl ketone and cyclohexanone, are more preferred. In addition, the solvent used in varnish preparation may be of the same type as the solvents used in the production of the polyphenylene ether-modified butadiene prepolymer, or may also be solvents of different types.

At the time of preparing a varnish, it is preferable to adjust the amount of use of the solvent such that the concentration of solids (involatile fraction) in the varnish reaches 5 to 80% by weight. However, by adjusting the amount of solvent during the production of a prepreg or the like using the resin varnish of the present invention, preparation can be achieved to reach a concentration of solids (involatile fraction) or varnish viscosity that is optimum for coating operation (for example, to achieve good external appearance and an appropriate amount of applied resin).

The prepreg or metal clad laminated board of the present invention can be produced by a known method, using the above-described resin composition and resin varnish of the present invention. For example, the prepreg is obtained by impregnating the thermosetting resin composition and resin varnish of the present invention into a reinforced fiber substrate such as glass fiber or organic fiber, and then drying the resultant in a drying oven or the like, typically at a temperature of 60 to 200° C., and preferably 80 to 170° C., for 2 to 30 minutes, and preferably for 3 to 15 minutes. Subsequently, one sheet or multiple sheets of this prepreg are stacked, metal foil is disposed on one side or both sides of the stacked prepreg, and the assembly is heated and/or pressed under predetermined conditions. Thus, a double-sided or single-sided metal clad laminated board may be obtained. Heating in this case can be performed preferably in the temperature range of 100° C. to 250° C., while pressing can be performed preferably in the pressure range of 0.5 to 10.0 MPa. It is preferable to perform heating and pressing simultaneously using a vacuum press or the like, and in this case, these treatments are preferably performed for 30 minutes to 10 hours. Furthermore, when circuit formation processing by means of perforation processing, metal plating processing, metal foil etching or the like, and multilayer adhesion processing are performed according to known methods, using the prepreg or metal clad laminated board produced as described above, a single-sided, double-sided or multilayer printed circuit board may be obtained.

The present invention is not limited to the above-described forms or aspects, and any alterations and modifications can be carried out within the scope of not deviating from the purpose of the invention.

EXAMPLES

Hereinafter, the present invention will be described in more detail by way of Examples, but the present invention is not intended to be limited to these Examples.

Preparation of Resin Varnish (Resin Composition)

Preparation Example 1

To a one-liter separable flask equipped with a thermometer, a reflux condenser, a lowered pressure concentration apparatus and a stirring apparatus, 350 parts by weight of toluene and 50 parts by weight of polyphenylene ether (S202A, manufactured by Asahi Kasei Chemicals Corporation, Mn: 16,000) as the component (A) were introduced, the temperature inside the flask was set to 90° C., and the contents were dissolved while stirring. Then, 100 parts by weight of a chemically unmodified butadiene polymer (B-3000, manufactured by Nippon Soda Co., Ltd., Mn: 3000, 1,2-vinyl structure: 90%) as the component (B) and 30 parts by weight of bis(4-maleimidophenyl)methane (BMI-1000, manufactured by Daiwa Fine Chemicals Co., Ltd.) as the component (C) were introduced, and methyl isobutyl ketone (MIBK) was introduced as a solvent so that the concentration of solids (involatile fraction) in the solution was made to reach 30% by weight. The mixture was continuously stirred, and it was confirmed that the contents were dissolved or uniformly dispersed. Thereafter, the temperature of the liquid was raised to 110° C. While maintaining the temperature at 110° C., 0.5 parts by weight of 1,1-bis(t-hexylperoxy)-3,3,5-trimethylcyclohexane (Perhexa TMH, manufactured by NOF Corporation) was incorporated as a reaction initiator. The mixture was subjected to a preliminary reaction for about one hour while stirring, to obtain a polyphenylene ether-modified butadiene prepolymer solution in which the (A) polyphenylene ether, (B) chemically unmodified butadiene polymer and (C) crosslinking agent were compatibilized. The conversion rate of bis(4-maleimidophenyl)methane in this polyphenylene ether-modified butadiene prepolymer solution was measured using gel permeation chromatography (GPC). The conversion rate was 33%. The conversion rate is a value obtained by subtracting the unconverted fraction (measured value) of bis (4-maleimidophenyl)methane from 100.

Subsequently, the temperature of the liquid in the flask was set at 80° C. Thereafter, the solution was concentrated while stirring, so that the solid concentration in the solution was made to reach 45% by weight. Then, the solution was cooled to room temperature. Subsequently, 5 parts by weight of 1,1'-bis(t-butylperoxy)diisopropylbenzene (Perbutyl P, manufactured by NOF Corporation) was added as the component (D). Then, methyl ethyl ketone (MEK) was incorporated to prepare a resin varnish of Preparation Example 1 (solid concentration: about 40% by weight).

Preparation Example 2

A polyphenylene ether-modified butadiene prepolymer was obtained in the same manner as in Preparation Example 1, except that 30 parts by weight of polyphenylmethanemaleimide (BMI-2000, manufactured by Daiwa Fine Chemicals Co., Ltd.) was used instead of the bis(4-maleimidophenyl) methane used as the component (C) in Preparation Example 1. The conversion rate of BMI-2000 in this polyphenylene ether-modified butadiene prepolymer solution was measured using GPC. The conversion rate was 35%.

Subsequently, a resin varnish of Preparation Example 2 (solid concentration: about 40% by weight) was prepared using this solution, in the same manner as in Preparation Example 1.

Preparation Example 3

A polyphenylene ether-modified butadiene prepolymer was obtained in the same manner as in Preparation Example 1, except that 35 parts by weight of bis(3-ethyl-5-methyl-4-maleimidophenyl)methane (BMI-5100, manufactured by Daiwa Fine Chemicals Co., Ltd.) was used instead of the bis(4-maleimidophenyl)methane used as the component (C) in Preparation Example 1. The conversion rate of BMI-5100 in this polyphenylene ether-modified butadiene prepolymer solution was measured using GPC. The conversion rate was 25%. Subsequently, a resin varnish of Preparation Example 3 (solid concentration: about 40% by weight) was prepared using this solution, in the same manner as in Preparation Example 1.

Preparation Example 4

A polyphenylene ether-modified butadiene prepolymer was obtained in the same manner as in Preparation Example 1, except that 40 parts by weight of 2,2-bis(4-(4-maleimidophenoxy)phenyl)propane (BMI-4000, manufactured by Daiwa Fine Chemicals Co., Ltd.) was used instead of the bis(4-maleimidophenyl)methane used as the component (C) in Preparation Example 1. The conversion rate of BMI-4000 in this polyphenylene ether-modified butadiene prepolymer solution was measured using GPC. The conversion rate was 30%. Subsequently, a resin varnish of Preparation Example (solid concentration: about 40% by weight) was prepared using this solution, in the same manner as in Preparation Example 1.

Preparation Example 5

(a) A polyphenylene ether-modified butadiene prepolymer was obtained in the same manner as in Preparation Example 1, except that 15 parts by weight of N-phenylmaleimide (Imilex-P, manufactured by Nippon Shokubai Co., Ltd.) was used instead of the bis(4-maleimidophenyl)methane used as the component (C) in Preparation Example 1. The conversion rate of Imilex-P in this polyphenylene ether-modified butadiene prepolymer solution was measured using GPC. The conversion rate was 26%.

(b) Subsequently, this solution was concentrated in the same manner as in Preparation Example 1, and then, while maintaining the liquid temperature at 80° C., 25 parts by weight of 2,2-bis(4-(4-maleimidophenoxy)phenyl)propane (BMI-4000, manufactured by Daiwa Fine Chemicals Co., Ltd.) was incorporated therein as the component (E). Then, after cooling the system to room temperature while stirring, 5 parts by weight of 1,1'-bis(t-butylperoxy) diisopropylbenzene (Perbutyl-P, manufactured by NOF Corporation) was added as the component (D). Then, methyl ethyl ketone (MEK) was incorporated to prepare a resin varnish of Preparation Example 5 (solid concentration: about 40% by weight).

Preparation Example 6

A polyphenylene ether-modified butadiene prepolymer was obtained in the same manner as in Preparation Example 5, except that 15 parts by weight of bis(4-maleimidophenyl)methane (BMI-1000, manufactured by Daiwa Fine Chemicals Co., Ltd.) was used instead of the N-phenylmaleimide used as the component (C) in Preparation Example 5(a). The conversion rate of BMI-1000 in this polyphenylene ether-modified butadiene prepolymer solution was measured using GPC. The conversion rate was 32%.

Subsequently, a resin varnish of Preparation Example 6 (solid concentration: about 40% by weight) was prepared using this solution, in the same manner as in Preparation Example 5(b).

Preparation Example 7

(a) A polyphenylene ether-modified butadiene prepolymer was obtained in the same manner as in Preparation Example 5, except that 25 parts by weight of 2,2-bis(4-(4-maleimidophenoxy)phenyl)propane (BMI-4000, manufactured by Daiwa Fine Chemicals Co., Ltd.) was used instead of the N-phenylmaleimide used as the component (C) in Preparation Example 5(a). The conversion rate of BMI-4000 in this polyphenylene ether-modified butadiene prepolymer solution was measured using GPC. The conversion rate was 31%.

(b) Subsequently, using this solution, a resin varnish of Preparation Example 7 (solid concentration: about 40% by weight) was prepared in the same manner as in Preparation Example 5, except that 15 parts by weight of bis(3-ethyl-5-methyl-4-maleimidophenyl)methane (BMI-5100, manufactured by Daiwa Fine Chemicals Co., Ltd.) was used instead of the 2,2-bis(4-(4-maleimidophenoxy)phenyl)propane used as the component (E) in Preparation Example 5(b), and 70 parts by weight of ethylenebis(pentabromophenyl) (SAY-TEX8010, manufactured by Albemarle Corporation) was incorporated as the component (F).

Preparation Example 8

A polyphenylene ether-modified butadiene prepolymer was obtained in the same manner as in Preparation Example 7, except that the mixing amount of 2,2-bis(4-(4-maleimidophenoxy)phenyl)propane (BMI-4000, manufactured by Daiwa Fine Chemicals Co., Ltd.) used as the component (C) in Preparation Example 7(a) was changed to 40 parts by weight. The conversion rate of BMI-4000 in this polyphenylene ether-modified butadiene prepolymer solution was measured using GPC. The conversion rate was 30%.

Subsequently, using this solution, a resin varnish of Preparation Example 8 (solid concentration: about 40% by weight) was prepared in the same manner as in Preparation Example 7, except that 10 parts by weight of a styrene-butadiene copolymer (Tufprene 125, Asahi Kasei Chemicals Corp.) was incorporated instead of the bis(3-ethyl-5-methyl-4-maleimidophenyl)methane used as the component (E) in Preparation Example 7(b), and 70 parts by weight of ethylenebistetrabromophthalimide (BT-93W, manufactured by Albemarle Corporation) was incorporated instead of ethylenebis(pentabromophenyl).

Preparation Example 9

(a) A polyphenylene ether-modified butadiene prepolymer was obtained in the same manner as in Preparation Example 1, except that 20 parts by weight of divinylbiphenyl (Nippon Steel Chemical Co., Ltd.) was used instead of the bis(4-maleimidophenyl)methane used as the component (C) in Preparation Example 1. The conversion rate of divinylbiphenyl in this polyphenylene ether-modified butadiene prepolymer solution was measured using GPC. The conversion rate was 28%.

(b) Subsequently, this solution was concentrated in the same manner as in Preparation Example 1, and then while maintaining the liquid temperature at 80° C., 70 parts by weight of brominated polystyrene (PBS64HW, manufactured by Great Lakes Chemical Corp.) was incorporated as the component (F). Then, after cooling the system to room temperature while stirring, 5 parts by weight of 1,1'-bis(t-butylperoxy)diisopropylbenzene (Perbutyl P, manufactured by NOF Corporation) was added as the component (D), and then methyl ethyl ketone (MEK) was incorporated to prepare a resin varnish of Preparation Example 9 (solid concentration: about 40% by weight).

Preparation Example 10

To a resin varnish prepared in the same manner as in Preparation Example 3 (conversion rate of BMI-5100 in the polyphenylene ether-modified butadiene prepolymer solution was 24%), 35 parts by weight of spherical silica (SO-25R, average particle size: 0.5 μm, manufactured by Admatex Co., Ltd.) was incorporated as the inorganic filler of the component (G), and then methyl ethyl ketone (MEK) was incorporated to prepare a resin varnish of Preparation Example 10 (solid concentration: about 45% by weight).

Preparation Example 11

A polyphenylene ether-modified butadiene prepolymer was obtained in the same manner as in Preparation Example 3, except that Ricon142 (manufactured by Sartomer Corp., Mn: 3900, 1,2-vinyl structure: 55%) was used instead of B-3000 as the chemically unmodified butadiene polymer of the component (B) in Preparation Example 3. The conversion rate of BMI-5100 in this polyphenylene ether-modified butadiene prepolymer solution was measured using GPC. The conversion rate was 27%. Subsequently, using this solution, a resin varnish of Preparation Example 11 (solid concentration: about 40% by weight) was prepared in the same manner as in Preparation Example 3.

Comparative Preparation Example 1

To a one-liter separable flask equipped with a thermometer, a reflux condenser and a stirring apparatus, 200 parts by weight of toluene and 50 parts by weight of polyphenylene ether (S202A, manufactured by Asahi Kasei Chemicals Corp., Mn: 16,000) were introduced, the temperature inside the flask was set at 90° C., and the contents were dissolved with stirring. Subsequently, 100 parts by weight of triallyl isocyanurate (TRIC, manufactured by Nippon Kasei Chemical Co., Ltd.) was introduced, it was confirmed that the contents were dissolved or uniformly dispersed, and then the system was cooled to room temperature. Then, after cooling the system to room temperature while stirring, 5 parts by weight of 1,1'-bis(t-butylperoxy)diisopropylbenzene (Perbutyl P, manufactured by NOF Corporation) was added as a reaction initiator, and then methyl ethyl ketone (MEK) was incorporated to prepare a resin varnish of Comparative Preparation Example 1 (solid concentration: about 40% by weight).

Comparative Preparation Example 2

A resin varnish of Comparative Preparation Example (solid concentration: about 40% by weight) was prepared in the same manner as in Comparative Preparation Example 1, except that 100 parts by weight of bis(3-ethyl-5-methyl-4-maleimidophenyl)methane (BMI-5100, manufactured by Daiwa Fine Chemicals Co., Ltd.) was used instead of the triallyl isocyanurate used in Comparative Preparation Example 1.

Comparative Preparation Example 3

A resin varnish of Comparative Preparation Example 3 (solid concentration: about 40% by weight) was prepared in the same manner as in Comparative Preparation Example 1, except that 100 parts by weight of a chemically unmodified butadiene polymer (B-3000, manufactured by Nippon Soda Co., Ltd., Mn: 3000, 1,2-vinyl structure: 90%) was used instead of the triallyl isocyanurate used in Comparative Preparation Example 1.

Comparative Preparation Example 4

A resin varnish of Comparative Preparation Example 4 (solid concentration: about 40% by weight) was prepared in the same manner as in Comparative Preparation Example 3, except that 50 parts by weight of triallyl isocyanurate (TRIC, manufactured by Nippon Kasei Chemical Co., Ltd.) was further added compared to Comparative Preparation Example 3.

Comparative Preparation Example 5

A resin varnish of Comparative Preparation Example 5 (solid concentration: about 40% by weight) was prepared in the same manner as in Comparative Preparation Example 4, except that 30 parts by weight of bis(4-maleimidophenyl)methane (BMI-1000, manufactured by Daiwa Fine Chemicals Co., Ltd.) was used instead of the triallyl isocyanurate used in Comparative Preparation Example 4.

Comparative Preparation Example 6

To a one-liter separable flask equipped with a thermometer, a reflux condenser, a lowered pressure concentrating apparatus and a stirring apparatus, 350 parts by weight of toluene and 50 parts by weight of polyphenylene ether (S202A, manufactured by Asahi Kasei Chemicals, Corp., Mn: 16,000) were introduced, the temperature inside the flask was set at 90° C., and the contents were dissolved with stirring. Subsequently, 100 parts by weight of glycol-modified 1,2-polybutadiene having hydroxyl groups at the ends (G-3000, manufactured by Nippon Soda Co., Ltd., Mn: 3000, 1,2-vinyl structure: 90%) and 30 parts by weight of bis(4-maleimidophenyl)methane (BMI-1000, manufactured by Daiwa Fine Chemicals Co., Ltd.) were introduced, and methyl isobutyl ketone (MIBK) was introduced so that the concentration of solids (involatile fraction) in the solution was made to reach 30% by weight. It was confirmed that the contents were dissolved or uniformly dispersed, and then while maintaining the liquid temperature at 110° C., 0.5 parts by weight of 1,1-bis(t-hexylperoxy)-3,3,5-trimethylcyclohexane (Perhexa TMH, manufactured by NOF Corporation) was incorporated as a reaction initiator. The contents were subjected to a preliminary reaction for about 10 minutes while stirring. The conversion rate of BMI-1000 in this preliminarily reaction product was measured using GPC. The conversion rate was 4%. Subsequently, the liquid temperature in the flask was set at 80° C., and then the solution was concentrated while stirring, so that the concentration of solids (involatile fraction) of the solution was made to reach 45% by weight. Then, the solution was cooled to room temperature. Thereafter, 5 parts by weight of 1,1'-bis(t-butylperoxy)diisopropylbenzene (Perbutyl P, manufactured by NOF Corporation) was added as a reaction initiator, and then methyl ethyl ketone (MEK) was incorporated to prepare a resin varnish of Comparative Preparation Example 6 (solid concentration: about 40% by weight).

Comparative Preparation Example 7

A preliminary reaction product was obtained in the same manner as in Comparative Preparation Example 6, except that 100 parts by weight of carboxylic acid-modified 1,2-polybutadiene having carboxyl groups at the ends (C-1000, manufactured by Nippon Soda Co., Ltd., Mn: 1400, 1,2-vinyl structure: 89%) was used instead of the glycol-modified 1,2-polybutadiene used in Comparative Preparation Example 6. The conversion rate of BMI-1000 in this preliminary reaction product was measured using GPC. The conversion rate was 19%. Subsequently, using this solution, a resin varnish of Comparative Preparation Example 7 (solid concentration: about 40% by weight) was prepared in the same manner as in Comparative Preparation Example 6.

Comparative Preparation Example 8

A preliminary reaction product of polybutadiene was obtained in the presence of polyphenylene ether in the same manner as in Preparation Example 1, except that Ricon130 (manufactured by Sartomer Corp., Mn: 2500, 1,2-vinyl structure: 28%) was used instead of B-3000 as the butadiene homopolymer used in Preparation Example 1. The conversion rate of BMI-1000 in this preliminary reaction product was measured using GPC. The conversion rate was 24%. Subsequently, using this solution, a resin varnish of Comparative Preparation Example 8 (solid concentration: about 40% by weight) was prepared in the same manner as in Preparation Example 1.

The amounts of use of the various raw materials used in the preparation of the resin varnishes (curable resin compositions) of Preparation Examples 1 to 11 and Comparative Preparation Examples 1 to 8 are summarized and shown in Table 1.

TABLE 1

| | | Preparation Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Polyphenylene ether | | 50 | 50 | 50 | 50 | 50 | 50 | 50 | 50 | 50 | 50 | 50 |
| Butadiene homopolymer | | 100 | 100 | 100 | 100 | 100 | 100 | 100 | 100 | 100 | 100 | 100 |
| Glycol-modified polybutadiene | | — | — | — | — | — | — | — | — | — | — | — |
| Carboxylic acid-modified polybutadiene | | — | — | — | — | — | — | — | — | — | — | — |
| Crosslinking agent | BMI-1000 | 30 | — | — | — | — | 15 | — | — | — | — | — |
| | BMI-2000 | — | 30 | — | — | — | — | — | — | — | — | — |
| | BMI-5100 | — | — | 35 | — | — | — | 15 | — | — | 35 | 35 |
| | BMI-4000 | — | — | — | 40 | 25 | 25 | 25 | 40 | — | — | — |
| | Imilex-P | — | — | — | — | 15 | — | — | — | — | — | — |
| | Divinylbiphenyl | — | — | — | — | — | — | — | — | 20 | — | — |
| TAIC | | — | — | — | — | — | — | — | — | — | — | — |
| Reaction initiator | Perhexa TMH | 0.5 | 0.5 | 0.5 | 0.5 | 0.5 | 0.5 | 0.5 | 0.5 | 0.5 | 0.5 | 0.5 |
| | Perbutyl P | 5 | 5 | 5 | 5 | 5 | 5 | 5 | 5 | 5 | 5 | 5 |
| Flame retardant | SAYTEX8010 | — | — | — | — | — | — | 70 | — | — | — | — |
| | BT-93W | — | — | — | — | — | — | — | 70 | — | — | — |
| | PBS64HW | — | — | — | — | — | — | — | — | 70 | — | — |
| Styrene-butadiene copolymer | | — | — | — | — | — | — | — | 10 | — | — | — |
| Inorganic filler | SO-25R | — | — | — | — | — | — | — | — | — | 35 | — |

| | | Comparative Preparation Example | | | | | | | |
|---|---|---|---|---|---|---|---|---|---|
| | | 1 | 2 | 3 | 4 | 5 | 6 | 7 | 8 |
| Polyphenylene ether | | 50 | 50 | 50 | 50 | 50 | 50 | 50 | 50 |
| Butadiene homopolymer | | — | — | 100 | 100 | 100 | — | — | 100 |
| Glycol-modified polybutadiene | | — | — | — | — | — | 100 | — | — |
| Carboxylic acid-modified polybutadiene | | — | — | — | — | — | — | 100 | — |
| Crosslinking agent | BMI-1000 | — | — | — | — | 30 | 30 | 30 | 30 |
| | BMI-2000 | — | — | — | — | — | — | — | — |
| | BMI-5100 | — | 100 | — | — | — | — | — | — |
| | BMI-4000 | — | — | — | — | — | — | — | — |
| | Imilex-P | — | — | — | — | — | — | — | — |
| | Divinylbiphenyl | — | — | — | — | — | — | — | — |
| TAIC | | 100 | — | — | 50 | — | — | — | — |
| Reaction initiator | Perhexa TMH | — | — | — | — | — | 0.5 | 0.5 | 0.5 |
| | Perbutyl P | 5 | 5 | 5 | 5 | 5 | 5 | 5 | 5 |
| Flame retardant | SAYTEX8010 | — | — | — | — | — | — | — | — |
| | BT-93W | — | — | — | — | — | — | — | — |
| | PBS64HW | — | — | — | — | — | — | — | — |
| Styrene-butadiene copolymer | | — | — | — | — | — | — | — | — |
| Inorganic filler | SO-25R | — | — | — | — | — | — | — | — |

(Mixing in parts by weight)

The abbreviations in the table have the following meanings.
BMI: Bismaleimide compound
Imilex P: N-phenylmaleimide
TRIC: Triallyl isocyanurate
Perhexa TMH: 1,1-Bis(t-hexylperoxy)-3,3,5-trimethylcyclohexane
Perbutyl P: 1,1'-Bis(t-butylperoxy)diisopropylbenzene
SAYTEX8010: Ethylenebis(pentabromophenyl)
BT-93W: Ethylenebistetrabromophthalimide
PBS64HW: Brominated polystyrene
SO-25R: Spherical silica Production of Prepreg A glass fabric (E Glass, manufactured by Nitto Boseki Co., Ltd.) having a thickness of 0.1 mm was impregnated with the resin varnishes obtained in Preparation Examples 1 to 11 and Comparative Preparation Examples 1 to 8, and then the resultant was dried by heating at 100° C. for 5 minutes, to produce prepregs having a resin-containing proportion of 50% by weight of Preparation Examples 1 to 11 and Comparative Preparation Examples 1 to 8, respectively. In addition, the cases of using the resin varnishes of Preparation Examples 1 to 11 correspond to the Fabrication Examples 1 to 11, respectively, and the cases of using the resin varnishes of Comparative Preparation Examples 1 to 8 correspond to the Comparative Fabrication Examples 1 to 8, respectively.

Evaluation of Prepreg

The external appearance and tackiness of the above-mentioned prepregs of Fabrication Examples 1 to 11 and Comparative Fabrication Examples 1 to 8 were evaluated. The evaluation results are presented in Table 2. The external appearance was evaluated by naked eyes, and a prepreg having some irregularities, streaks and the like on the surface, and having insufficient surface smoothness was rated as "poor", while a prepreg having no irregularities, streaks or the like, and being uniform was rated as "good". Also, for the tackiness of the prepreg, the prepreg which showed any stickiness (tackiness) on the surface at 25° C. was rated as "poor" otherwise rated as "good".

Production of Double-sided Copper-clad Laminate

A construct produced by stacking 4 sheets of the prepreg from each of the Fabrication Examples 1 to 11 and Comparative Fabrication Examples 1 to 8 (not pressed) was provided, and low profile copper foil (F3-WS, M surface Rz: 3 μm, manufactured by Furukawa Electric Co., Ltd.) having a thickness of 18 μm was disposed on both sides of the construct such that the M surface was in contact with the prepreg. The assembly was molded by hot pressing under the pressing conditions of 200° C. and 2.9 MPa for 70 minutes, to produce a double-sided copper-clad laminate (thickness: 0.5 mm). Furthermore, for each of the prepregs of Fabrication Example 1 and Comparative Fabrication Example 1, a double-sided copper-clad laminate using a general copper foil (GTS, M surface Rz: 8 μm, manufactured by Furukawa Electric Co., Ltd.) having a thickness of 18 μm as the copper foil, was produced under the same pressing conditions as the conditions used in the case of using low profile copper foil. In addition, the combinations of the prepregs of Fabrication Examples 1 to 11 and Comparative Fabrication Examples 1 to 8 and the copper foil used therewith in the copper-clad laminates of Examples 1 to 12 and Comparative Examples 1 to 9, are presented in Table 2.

Evaluation of Features of Double-sided Copper-clad Laminate

For the copper-clad laminates of Examples 1 to 12 and Comparative Examples 1 to 9, the transmission loss, dielectric properties, copper foil peeling strength, solder heat resistance and thermal expansion coefficient were evaluated. The evaluation results are presented in Table 2. The methods for evaluating the properties of a copper-clad laminate are as follows.

Measurement of Transmission Loss and Dielectric Properties

The transmission loss of a copper-clad laminate was measured by a triplate line resonator method using a vector-type network analyzer. In addition, the measurement conditions were as follows; line width: 0.6 mm, distance of insulating layer between the upper and lower ground conductors: about 1.0 mm, line length: 200 mm, characteristic impedance: about 50Ω, frequency: 3 GHz, measurement temperature: 25° C. From the obtained transmission loss, the dielectric properties (dielectric constant, dielectric dissipation factor) at 3 GHz were calculated.

Measurement of Copper Foil Peeling Strength

The copper foil peeling strength of the copper-clad laminate was measured according to the testing standards for copper-clad laminates, JIS-C-6481 (measured in steady state).

For the measurement, a copper-clad laminate was produced, and then the copper foil was etched to produce lines for measurement and testing (width: 10 mm±0.1 mm). Subsequently, the peeling strength was measured at a peeling rate of about 50 mm/min.

Evaluation of Solder Heat Resistance of Copper-clad Laminate

Each of the above-mentioned copper-clad laminates was cut to a square 50 mm on each side, and was subjected to etching of the copper foil on one side or both sides, and the laminate was maintained in its steady state or in a pressure cooker test (PCT) apparatus (conditions: 121° C., 2.2 atmospheres) for a predetermined time (1, 3 and 5 hours). Then, the laminate was immersed in molten solder at 288° C. for 20 seconds, and the external appearance of the obtained copper-clad laminate (three sheets) was examined by naked eyes. In addition, the numbers in the table mean the number of sheets that were not recognized to have occurrences of swelling or measling within the substrate (within the insulating layer) as well as between the substrate and the copper foil.

Evaluation of Thermal Expansion Coefficient of Copper-clad Laminate

Each of the above-mentioned copper-clad laminates was subjected to etching of the copper foil on both sides, and cut to a square 5 mm on each side. The thermal expansion coefficients (in the direction of sheet thickness, 30 to 130° C.) of the laminates were measured by TMA.

TABLE 2

| | Resin varnish | Prepreg | Copper foil | Prepreg properties External appearance | Prepreg properties Tackiness | Dielectric constant (3 GHz) | Dielectric dissipation factor (3 GHz) |
|---|---|---|---|---|---|---|---|
| Example 1 | Preparation Example 1 | Fabrication Example 1 | Low profile foil | ○ | ○ | 3.27 | 0.0032 |
| Example 2 | Preparation Example 1 | Fabrication Example 1 | Common foil | ○ | ○ | 3.27 | 0.0032 |
| Example 3 | Preparation Example 2 | Fabrication Example 2 | Low profile foil | ○ | ○ | 3.30 | 0.0034 |
| Example 4 | Preparation Example 3 | Fabrication Example 3 | Low profile foil | ○ | ○ | 3.23 | 0.0033 |
| Example 5 | Preparation Example 4 | Fabrication Example 4 | Low profile foil | ○ | ○ | 3.24 | 0.0032 |
| Example 6 | Preparation Example 5 | Fabrication Example 5 | Low profile foil | ○ | ○ | 3.25 | 0.0031 |
| Example 7 | Preparation Example 6 | Fabrication Example 6 | Low profile foil | ○ | ○ | 3.26 | 0.0032 |
| Example 8 | Preparation Example 7 | Fabrication Example 7 | Low profile foil | ○ | ○ | 3.27 | 0.0031 |
| Example 9 | Preparation Example 8 | Fabrication Example 8 | Low profile foil | ○ | ○ | 3.30 | 0.0032 |
| Example 10 | Preparation Example 9 | Fabrication Example 9 | Low profile foil | ○ | ○ | 3.24 | 0.0031 |
| Example 11 | Preparation Example 10 | Fabrication Example 10 | Low profile foil | ○ | ○ | 3.30 | 0.0031 |
| Example 12 | Preparation Example 11 | Fabrication Example 11 | Low profile foil | ○ | ○ | 3.25 | 0.0033 |
| Comparative Example 1 | Comparative Preparation Example 1 | Comparative Fabrication Example 1 | Low profile foil | ○ | ○ | 3.70 | 0.0054 |
| Comparative Example 2 | Comparative Preparation Example 1 | Comparative Fabrication Example 1 | Common foil | ○ | ○ | 3.70 | 0.0054 |
| Comparative Example 3 | Comparative Preparation Example 2 | Comparative Fabrication Example 2 | Low profile foil | ○ | ○ | 3.93 | 0.0163 |
| Comparative Example 4 | Comparative Preparation Example 3 | Comparative Fabrication Example 3 | Low profile foil | X | X | 3.27 | 0.0034 |
| Comparative Example 5 | Comparative Preparation Example 4 | Comparative Fabrication Example 4 | Low profile foil | X | X | 3.45 | 0.0042 |
| Comparative Example 6 | Comparative Preparation Example 5 | Comparative Fabrication Example 5 | Low profile foil | X | X | 3.31 | 0.0036 |
| Comparative Example 7 | Comparative Preparation Example 6 | Comparative Fabrication Example 6 | Low profile foil | X | X | 3.71 | 0.0144 |
| Comparative Example 8 | Comparative Preparation Example 7 | Comparative Fabrication Example 7 | Low profile foil | ○ | ○ | 3.76 | 0.0160 |
| Comparative Example 9 | Comparative Preparation Example 8 | Comparative Fabrication Example 8 | Low profile foil | ○ | ○ | 3.31 | 0.0037 |

TABLE 2-continued

| | Transmission loss (dB/m, 3 GHz) | Peeling strength (kN/m) | Solder heat resistance (steady state, after PCT treatment) | | | | Thermal expansion coefficient (ppm/° C.) |
|---|---|---|---|---|---|---|---|
| | | | Steady state | PCT 1 h | PCT 3 h | PCT 5 h | |
| Example 1 | 3.64 | 0.82 | 3 | 3 | 3 | 3 | 60 |
| Example 2 | 4.29 | 1.12 | 3 | 3 | 3 | 3 | 60 |
| Example 3 | 3.72 | 0.84 | 3 | 3 | 3 | 3 | 59 |
| Example 4 | 3.65 | 0.81 | 3 | 3 | 3 | 3 | 53 |
| Example 5 | 3.62 | 0.93 | 3 | 3 | 3 | 3 | 60 |
| Example 6 | 3.57 | 0.90 | 3 | 3 | 3 | 3 | 61 |
| Example 7 | 3.62 | 0.92 | 3 | 3 | 3 | 3 | 60 |
| Example 8 | 3.56 | 0.91 | 3 | 3 | 3 | 3 | 55 |
| Example 9 | 3.65 | 0.95 | 3 | 3 | 3 | 3 | 61 |
| Example 10 | 3.57 | 0.77 | 3 | 3 | 3 | 3 | 65 |
| Example 11 | 3.57 | 0.78 | 3 | 3 | 3 | 3 | 51 |
| Example 12 | 3.68 | 0.82 | 3 | 3 | 3 | 3 | 55 |
| Comparative Example 1 | 5.02 | 0.58 | 3 | 3 | 3 | 1 | 65 |
| Comparative Example 2 | 5.72 | 0.92 | 3 | 3 | 3 | 3 | 65 |
| Comparative Example 3 | 11.04 | 0.72 | 3 | 3 | 3 | 2 | 56 |
| Comparative Example 4 | 3.74 | 0.49 | 3 | 2 | 0 | 0 | 88 |
| Comparative Example 5 | 4.24 | 0.55 | 3 | 3 | 1 | 0 | 84 |
| Comparative Example 6 | 3.86 | 0.56 | 3 | 1 | 0 | 0 | 76 |
| Comparative Example 7 | 9.73 | 0.70 | 3 | 3 | 2 | 0 | 84 |
| Comparative Example 8 | 10.64 | 0.79 | 3 | 2 | 1 | 0 | 80 |
| Comparative Example 9 | 3.90 | 0.80 | 3 | 3 | 3 | 3 | 73 |

Comparison was made between low profile foil and common foil in the case where the resin varnishes and prepregs derived from the same resin composition were used, as can be seen from Examples 1 and 2 or from Comparative Examples 1 and 2. In this case, the resin compositions with low profile foil had excellent transmission loss properties, but in contrast, the resin compositions with low profile foil had inferior peeling strength between the resin composition and the low profile foil (peeling strength). Particularly, in Comparative Example 1 where low profile foil was used with a conventional resin composition, slight improvement was seen in the transmission loss, from 5.72 dB/m of the common foil to 5.02 dB/m of the low profile foil; however, the peeling strength was lowered from 0.92 kN/m of the common foil to 0.58 kN/m of the low profile foil, which value is insufficient in actual use.

This demonstrates, as stated with regard to the problems described above, that low profile foil is superior to common foil in the lowering of transmission loss, and vice versa for the peeling strength between the resin composition and metal foil, and for that reason, it is difficult to achieve a balance between the lowering of transmission loss and the required peeling strength between the resin composition and metal foil.

Furthermore, as is obvious from Table 2, the prepregs from Examples 1 to 12 utilizing the resin composition of the present invention all had no irregularities, streaks or the like in the external appearance, and they were uniform. Also, the prepregs were free of tackiness (tackiness of the surface), and thus had excellent prepreg properties. The properties of the laminates were also excellent, with the dielectric constant being 3.30 or less, and the dielectric dissipation factor being 0.0034 or less. The solder heat resistance was good in all of the three sheets of measurement samples, without any occurrence of swelling or measling being recognized. The laminates also had good thermal expansion properties, with the thermal expansion coefficient being 65 ppm/° C. or less.

With regard to the transmission loss and peeling strength, in Example 2 where the resin composition of the present invention and common foil were used, the transmission loss was remarkably excellent, with a value of 4.29, and the peeling strength was also excellent with a value of 1.12 kN/m, compared to Comparative Example 2 where common foil was used similarly.

The copper-clad laminates of Examples 1 and 3 to 12 where the resin composition of the present invention and low profile foil were used, had particularly excellent transmission loss, with a value of 3.72 or less, regardless of the use of low profile foil, and had excellent peeling strength, with a value of 0.77 or more. Thus, it is clear that the resin composition of the present invention is a resin composition which is very effective in achieving a balance between the lowering of transmission loss and peeling strength.

Comparative Examples 1 and 2 relate to a system of polyphenylene ether and triallyl isocyanurate, and Comparative Example 1 corresponds to the inventions of Patent Documents 4 and 5 in the case of using low profile foil instead of common foil, while Comparative Example 2 using common foil corresponds to the inventions of Patent Documents 4 and 5. This system has good prepreg properties and thermal expansion coefficient, but has inferior dielectric constant, dielectric dissipation factor and transmission loss. Also, in the case of using low profile foil, the peeling strength is deteriorated, and the solder heat resistance is deteriorated, thus the comprehensive performance being unsatisfactory.

Comparative Example 3 relates to a system of polyphenylene ether and a bismaleimide compound, and corresponds to the invention of Patent Document 2 in the case of using low profile foil instead of common foil. This system has good prepreg properties and thermal expansion coefficient, but has inferior dielectric constant, dielectric dissipation factor and transmission loss. The system also has inferior peeling strength and inferior solder heat resistance, thus the comprehensive performance being unsatisfactory.

Comparative Example 4 relates to a system of conventional, non-compatibilized polyphenylene ether and a butadiene homopolymer, and corresponds to the inventions of Patent Documents 6 and 7 in the case of using low profile foil instead of common foil. This system has good dielectric constant, dielectric dissipation factor and transmission loss, but has inferior prepreg properties, peeling strength, solder heat resistance, and thermal expansion coefficient, thus the comprehensive performance being unsatisfactory. Since this system is subject to macro-phase separation, it can be easily distinguished by naked eyes from the samples prepared using the compatibilized composition of the present invention.

Comparative Example 5 relates to a system of conventional, non-compatibilized polyphenylene ether, a butadiene homopolymer, and triallyl isocyanurate. This system has insufficient dielectric constant, dielectric dissipation factor and transmission loss, and has inferior prepreg properties, peeling strength, solder heat resistance, and thermal expansion coefficient, thus the performance in general being inferior. Since this system is subject to macro-phase separation, it can be easily distinguished by naked eyes from the samples prepared using the compatibilized composition of the present invention.

Comparative Example 6 relates to a system of polyphenylene ether, a butadiene homopolymer and a maleimide compound, and corresponds to a resin composition which has the same components as the resin composition of the present invention, and is not compatibilized. This system has insufficient dielectric constant, dielectric dissipation factor and transmission loss, and has inferior prepreg properties, peeling strength, solder heat resistance, and thermal expansion coefficient, thus the performance in general being inferior. Since this system is subject to macro-phase separation, it can be easily distinguished by naked eyes from the samples prepared using the compatibilized composition of the present invention.

Comparative Example 7 relates to a system of conventional, non-compatibilized polyphenylene ether, glycol-modified polybutadiene and a maleimide compound, and corresponds to the invention of Patent Document 8 in the case of using low profile foil instead of common foil. This system has interior dielectric constant, dielectric dissipation factor and transmission loss, and has inferior prepreg properties, peeling strength, solder heat resistance, and thermal expansion coefficient, thus the performance in general being inferior. Since this system is subject to macro-phase separation, it can be easily distinguished by naked eyes from the samples prepared using the compatibilized composition of the present invention.

Comparative Example 8 relates to a system of polyphenylene ether, carboxylic acid-modified polybutadiene and a maleimide compound, and corresponds to the invention of Patent Document 8 in the case of using low profile foil instead of common foil. This system has good prepreg properties and peeling strength, but has inferior dielectric constant, dielectric dissipation factor and transmission loss, and inferior solder heat resistance and thermal expansion coefficient, thus the comprehensive performance being insufficient.

Comparative Example 9 relates to a system produced in the same manner as in Example 1, using a chemically unmodified butadiene polymer having less than 40% of the 1,2-vinyl structure, which is inapplicable to the present invention. Since this system has decreased curability concomitant to the decrease of crosslinking density as compared to the present invention, the dielectric dissipation factor and thermal expansion coefficient are inferior to those of Example 1.

INDUSTRIAL APPLICABILITY

The resin composition of the present invention has a novel constitution of being a thermosetting resin composition of compatibilized, uncured semi-IPN composite, and therefore, in the case of producing printed circuit boards using the resin composition and the like of the present invention, the resin composition has excellent electric properties of lowering transmission loss or good dielectric properties in high frequency bands, and excellent properties such as good heat resistance after moisture absorption or low thermal expansion properties, and sufficiently high peeling strength between the resin composition and metal foil (particularly, low profile foil).

Furthermore, a resin varnish, a prepreg and a metal clad laminated board can be formed using the resin composition of the present invention. The resin composition of the present invention, and the resin varnish, prepreg and metal clad laminated board using the resin composition, allowed lowering in the dielectric loss due to an enhancement of dielectric properties of the resin product itself, and thus an improvement of electric properties could be achieved. Furthermore, the resin composition and the like of the present invention have excellent properties of being applicable to metal foils having typical surface roughness, as well as even to metal foils having small surface roughness. For that reason, a combination of the resin composition of the present invention and a metal foil having small surface roughness further reduces conductor loss, and thus could achieve an improvement in the electric properties. Therefore, the combination can achieve a decrease in the transmission loss in high frequency bands to the extent that the level of requirements in the printed circuit boards industry is reached, and thus can be suitably used in the production of printed circuit boards used in high frequency applications.

Furthermore, since the resin composition, resin varnish, prepreg and metal clad laminated board of the present invention can achieve the above-mentioned properties, they are useful for the applications in members and elements of printed circuit boards that are used in various electric and electronic devices, such as mobile telecommunication devices dealing with high frequency bands, for example, signals of high frequencies of 1 GHz or greater, or devices for the base stations, network-associated electronic devices such as servers and routers, and large scale computers.

The invention claimed is:
1. A thermosetting resin composition comprising a polyphenylene ether-modified butadiene prepolymer which includes a polyphenylene ether (A) and a butadiene polymer, characterized in that the thermosetting resin composition is obtained by a process for manufacture of the thermosetting resin composition wherein:
the butadiene polymer has a crosslinked structure;
the process has a step (1) in which a butadiene polymer (B) crosslinks with a crosslinking agent (C) (excluding the butadiene polymer (B)) in the presence of the polyphenylene ether (A) in a medium to obtain the polyphenylene ether-modified butadiene prepolymer;
a number average molecular weight of the polyphenylene ether (A) is in a range of 7,000 to 30,000;

the butadiene polymer (B) molecule contains 40% or more of a 1,2-butadiene unit having a 1,2-vinyl group in a side chain;

the butadiene polymer (B) is not a modified polybutadiene in which the 1,2-vinyl group in the side chain, or one or both of the terminals in the molecule, is chemically modified to be converted to epoxy, glycol, phenol, maleic acid, (meth)acryl, or urethane, and the crosslinking agent (C) is at least one maleimide compound including 2,2-bis(4-(4-maleimidophenoxy)phenyl)propane or including bis-(3-ethyl-5-methyl-4-maleimidophenyl)methane.

2. The thermosetting resin composition according to claim 1, wherein:

the butadiene polymer (B) comprises:

(j) a —[$CH_2$—CH=CH—$CH_2$]— unit and (k) a —[$CH_2$—CH(CH=$CH_2$)]— unit, with a ratio of j:k being 60 to 5:40 to 95; and the crosslinking agent (C) is a compound having one or more ethylenically unsaturated double bonds in a molecule.

3. The thermosetting resin composition according to claim 1, wherein:

the crosslinking agent (C) is at least one maleimide compound including 2,2-bis(4-(4-maleimidophenoxy)phenyl)propane.

4. The thermosetting resin composition according to claim 1, wherein:

the crosslinking agent (C) is at least one maleimide compound including bis-(3-ethyl-5-methyl-4-maleimidophenyl)methane.

5. The thermosetting resin composition according to claim 1, wherein:

a mixing proportion of the polyphenylene ether (A) is in a range of 2 to 200 parts by weight based on 100 parts by weight of the total amount of the butadiene polymer (B) and the crosslinking agent (C), and a mixing proportion of the crosslinking agent (C) is in a range of 2 to 200 parts by weight based on 100 parts by weight of the butadiene polymer (B).

6. The thermosetting resin composition according to claim 1, wherein:

a conversion rate of the crosslinking agent (C) falls in the range of 5 to 100% in the step (1).

7. The thermosetting resin composition according to claim 1, wherein:

a radical reaction initiator (D) is further incorporated in the step (1) and then the butadiene polymer (B) crosslinks with the crosslinking agent (C).

8. The thermosetting resin composition according to claim 1, wherein:

the process further comprises a step (2) in which the polyphenylene ether-modified butadiene prepolymer obtained in the step (1) is incorporated with a radical reaction initiator (D).

9. The thermosetting resin composition according to claim 1, wherein:

the process further comprises a step (2) in which the polyphenylene ether-modified butadiene prepolymer obtained in the step (1) is incorporated with a compound (E) of a crosslinkable monomer or crosslinkable polymer which contains one or more groups having an ethylenically unsaturated double bond in a molecule.

10. The thermosetting resin composition according to claim 1, wherein:

the process further comprises a step (2) in which the polyphenylene ether-modified butadiene prepolymer obtained in the step (1) is incorporated with a compound (E) of a crosslinkable monomer or crosslinkable polymer which is at least one selected from the group consisting of a butadiene polymer (B-1), maleimide compounds and styrene-butadiene copolymers; and the butadiene polymer (B-1) is not a modified polybutadiene in which the 1,2-vinyl group in the side chain, or one or both of the terminals in the molecule, is chemically modified to be converted to epoxy, glycol, phenol, maleic acid, (meth)acryl, or urethane.

11. The thermosetting resin composition according to claim 1, wherein:

the process further comprises a step (2) in which the polyphenylene ether-modified butadiene prepolymer obtained in the step (1) is incorporated with a compound (F) of at least one of a bromine-based flame retardant and a phosphorus-based flame retardant.

12. The thermosetting resin composition according to claim 1, wherein:

the process further comprises a step (2) in which the polyphenylene ether-modified butadiene prepolymer obtained in the step (1) is incorporated with inorganic filler (G).

13. A resin varnish for printed circuit boards, obtained by dissolving or dispersing the thermosetting resin composition according to claim 1 in a solvent.

14. A prepreg obtained by impregnating the resin varnish for printed circuit boards according to claim 13 into a substrate, and then drying the impregnated substrate.

15. A metal clad laminated board obtained by stacking one or more sheets of the prepreg for printed circuit boards according to claim 14, disposing metal foil on one side or both sides of the stacked prepreg, and pressing them together while heating.

16. The thermosetting resin composition according to claim 1, wherein said step (1) is a preliminary reaction step in which the butadiene polymer (B) reacts with the crosslinking agent (C) so as to obtain said polyphenylene ether-modified butadiene prepolymer, in an uncured state before complete curing, having mutual entanglement of molecular chains of the polyphenylene ether (A) and crosslinking product between the butadiene polymer (B) and the crosslinking agent (C).

17. The thermosetting resin composition according to claim 1, which is a homogeneous composition.

* * * * *